(12) United States Patent
Ohnishi et al.

(10) Patent No.: US 7,029,988 B2
(45) Date of Patent: Apr. 18, 2006

(54) FABRICATION METHOD AND DEVICE STRUCTURE OF SHALLOW TRENCH INSULATION FOR SILICON WAFER CONTAINING SILICON-GERMANIUM

(75) Inventors: Kazuhiro Ohnishi, Kodaira (JP); Nobuyuki Sugii, Tokyo (JP); Takahiro Onai, Ome (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/936,684

(22) Filed: Sep. 9, 2004

(65) Prior Publication Data

US 2005/0032327 A1    Feb. 10, 2005

Related U.S. Application Data

(63) Continuation of application No. 10/445,927, filed on May 28, 2003.

(30) Foreign Application Priority Data

Jul. 3, 2002    (JP) .............................. 2002-194250

(51) Int. Cl.
  *H01L 21/76*    (2006.01)
  *H01L 21/36*    (2006.01)

(52) U.S. Cl. ...................... 438/424; 438/429; 438/430; 438/431; 438/432; 438/435; 438/492; 438/503; 438/504; 438/507

(58) Field of Classification Search ........ 438/218–224, 438/295–296, 424, 429–432, 435, 492, 503–504, 438/507; 257/19
See application file for complete search history.

(56) References Cited

U.S. PATENT DOCUMENTS 5,266,813 A    11/1993    Comfort et al. ............... 257/19
5,308,785 A *   5/1994    Comfort et al. ............. 438/429

(Continued)

FOREIGN PATENT DOCUMENTS

EP    0 552 671 A2 *   1/1993

OTHER PUBLICATIONS

Wolf, Jr. Ph.D., Stanley and Richard N. Tauber, Ph.D., "Thermal Oxidation of Single Crystal Silicon," Silicon Processing for the VLSI Era—vol. 1: Process Technology, Lattice Press, 1986, p. 198.*

(Continued)

*Primary Examiner*—Mary Wilczewski
*Assistant Examiner*—Toniae M. Thomas
(74) *Attorney, Agent, or Firm*—Reed Smith LLP; Stanley P. Fisher, Esq.; Juan Carlos A. Marquez, Esq.

(57) ABSTRACT

A method and device are provided for shallow trench isolation for a silicon wafer containing silicon-germanium. In one example, the method comprises forming a trench region in a silicon-germanium layer of a semiconductor substrate containing a single crystal silicon-germanium layer on the surface; forming a first single crystal silicon layer in the trench region and an active region; oxidizing the first single crystal silicon layer; forming a first thermal oxide layer on the surface of the first single crystal silicon layer; forming a device isolation region; embedding an insulator in the trench region; and forming a device in an active region over the single crystal silicon-germanium layer separated by the device isolation region, wherein the step of forming the device in the active region further includes forming a doped region of a depth to reach within the single crystal silicon-germanium layer below the first single crystal silicon layer.

19 Claims, 20 Drawing Sheets

U.S. PATENT DOCUMENTS

| | | |
|---|---|---|
| 5,994,178 A | 11/1999 | Wu ............................ 438/221 |
| 6,251,746 B1 | 6/2001 | Hong et al. ................. 438/424 |
| 6,399,970 B1 | 6/2002 | Kubo et al. ................. 257/194 |
| 6,537,894 B1* | 3/2003 | Skotnicki et al. ........... 438/424 |
| 6,583,000 B1* | 6/2003 | Hsu et al. ................... 438/222 |
| 6,600,170 B1 | 7/2003 | Xiang ......................... 257/18 |
| 6,673,696 B1* | 1/2004 | Arasnia et al. ............. 438/430 |
| 6,696,348 B1* | 2/2004 | Xiang ........................ 438/424 |
| 6,724,008 B1* | 4/2004 | Fitzergald .................... 257/19 |
| 6,825,086 B1* | 11/2004 | Lee et al. ................... 438/294 |
| 6,846,720 B1* | 1/2005 | Balasubramanian et al. ........................... 438/424 |
| 6,861,316 B1* | 3/2005 | Hara et al. ................. 438/285 |
| 2003/0013305 A1* | 1/2003 | Sugii et al. ................. 438/689 |
| 2003/0049893 A1* | 3/2003 | Currie et al. ............... 438/172 |
| 2004/0009636 A1* | 1/2004 | Ichinose et al. ............ 438/199 |
| 2004/0029355 A1* | 2/2004 | Hara et al. ................... 438/435 |
| 2004/0036142 A1* | 2/2004 | Shima ........................ 257/510 |
| 2004/0087107 A1* | 5/2004 | Takenaka .................... 438/431 |
| 2004/0142537 A1* | 7/2004 | Lee et al. .................... 438/424 |
| 2004/0164373 A1* | 8/2004 | Koester et al. ............. 257/499 |
| 2004/0173812 A1* | 9/2004 | Currie et al. ............... 257/103 |
| 2004/0180509 A1* | 9/2004 | Wang et al. ................ 438/424 |
| 2004/0256634 A1* | 12/2004 | Sugihara et al. ............ 257/192 |

OTHER PUBLICATIONS

K. Rim, S. Koester, M. Hargrove, J. Chu, P.M. Mooney, J. Ott, T. Kanarsky, P. Ronsheim, M. Ieong, A. Grill, H-S. P. Wong, "Strained Si NMOSFETs for High Performance CMOS Technology", 2001 Symposium on VLSI Technology Digest of Technical Papers, pp. 59-60.

* cited by examiner

FABRICATION METHOD AND DEVICE STRUCTURE OF SHALLOW TRENCH INSULATION FOR SILICON WAFER CONTAINING SILICON-GERMANIUM

CROSS REFERENCE TO RELATED APPLICATION

This application is a Continuation application of U.S. application Ser. No. 10/445,927 filed on May 28, 2003. Priority is claimed based on U.S. application Ser. No. 10/445,927 filed on May 28, 2003, which claims priority to Japanese Patent Application No. 2002-194250 filed on Jul. 3, 2002.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The present invention relates to semiconductor devices and a fabrication method thereof and relates in particular to MIS (Metal Insulator Semiconductors) type transistors and a fabrication method thereof.

2. Discussion of Background

Progress is being made in reducing the size of silicon devices for LSI (large scale integration) and rapid progress is being made in developing high performance devices with higher levels of integration according to scaling law. Along with making each element in the device smaller, scaling also lowers the supply voltage so that a relatively uniform electrical charge is applied to each element and allowing higher device performance using smaller elements. Currently, MOS-FET (Metal Oxide Semiconductor Field Effect Transistors) have a gate dielectric with a physical thickness of two nanometers or less. Making this gate dielectric even thinner is difficult due to the flow of large tunnel leakage current. The present gate dielectric size makes it impossible to increase the electrical charge in the inversion layer and hampers efforts to make higher performance devices.

To allow MOS-FET devices to handle larger current, the method of improving carrier mobility was considered. One method proposed to achieve better carrier mobility was a MOS-FET strained silicon channel made by epitaxial growth of a silicon layer on a layer of silicon-germanium. This method was for example disclosed in VLSI Tech. pp. 59–60 (2001) (hereafter referred to as Related Art 1). The strained silicon channel MOS-FET of this Related Art 1 utilized the difference in lattice spacing between the silicon-germanium layer and silicon layer to apply tensile stress to the silicon layer forming the device channel. Subjecting the silicon layer to tensile stress altered its band structure, giving it higher N and P type carrier mobility so that devices with a higher drive current could be obtained compared to silicon MOS-FET devices of the related art.

In order to develop a practical LSI strained silicon channel MOS-FET having this kind of high drive current, the preferred method used in recent years, forms a shallow trench isolation in contact with the silicon-germanium.

However, the liner oxidation process which is essential in the related art for forming the shallow trench isolation is difficult to perform on silicon-germanium. The difficulty is due to the oxidized germanium being physically unstable compared to the oxidized silicon as well as to its poor isolation characteristics.

To resolve this problem, a method was proposed to epitaxially form a silicon layer on the surface of the silicon-germanium layer and then oxidize the silicon layer surface to form a shallow trench isolation. A method for example was disclosed in U.S. Pat. No. 5,266,813 (hereafter referred to as Related Art 2). This Related Art 2 achieves a shallow trench isolation with low leakage current by covering the inside of the shallow trench with an oxidized layer on the silicon layer. Further, since the silicon germanium layer is covered by a layer of silicon, no unstable oxidized germanium is formed during the oxidation process and no impurities occur from the oxidation furnace due to the germanium.

To utilize the shallow trench isolation in a MOS-FET, it is essential to control the crystal conformation and shape of the active region contacting the shallow trench isolated so it will not generate leakage current referred to as MOS-FET kink. However regulating the current leakage in this section is difficult with the technology of the related art. In the method of related art 2 for example, when developing epitaxial growth on the silicon layer on the surface of the silicon germanium layer, a polycrystalline silicon layer is simultaneously formed on the surface of the dielectric (insulator) remaining from the silicon nitriding and silicon oxidizing processes. This polycrystalline silicon on the edge of the active region is therefore a cause of leakage current, causing defects typified by increased standby current in the MOS-FET.

SUMMARY OF THE INVENTION

The present invention provides a method and device for shallow trench insulation for a silicon wafer containing silicon-germanium. It should be appreciated that the present invention can be implemented in numerous ways, including as a process, an apparatus, a system, a device or a method. Several inventive embodiments of the present invention are described below.

In one embodiment, a method is provided for fabricating a semiconductor device. The method comprises forming a trench region in a silicon-germanium layer of a semiconductor substrate containing a single crystal silicon-germanium layer on the surface; forming a first single crystal silicon layer in the trench region and an active region; oxidizing the first single crystal silicon layer; forming a first thermal oxide layer on the surface of the first single crystal silicon layer; forming a device isolation region; embedding an insulator in the trench region; and forming a device in an active region over the single crystal silicon-germanium layer separated by the device isolation region, wherein the step of forming the device in the active region further includes forming a doped region of a depth to reach within the single crystal silicon-germanium layer below the first single crystal silicon layer.

The invention encompasses other embodiments of a method and an apparatus, which are configured as set forth above and with other features and alternatives.

BRIEF DESCRIPTION OF THE DRAWINGS

The present invention will be readily understood by the following detailed description in conjunction with the accompanying drawings. To facilitate this description, like reference numerals designate like structural elements.

DESCRIPTION OF THE PREFERRED EMBODIMENTS

An invention for a method and device for a shallow trench insulation for a silicon wafer containing silicon-germanium is disclosed. Numerous specific details are set forth in order to provide a thorough understanding of the present invention. It will be understood, however, to one skilled in the art, that the present invention may be practiced without some or all of these specific details.

FIG. 1 through FIG. 7 are cross sectional views of the process for forming the shallow trench isolation, in accordance with a first embodiment of the present invention.

Figure 1:
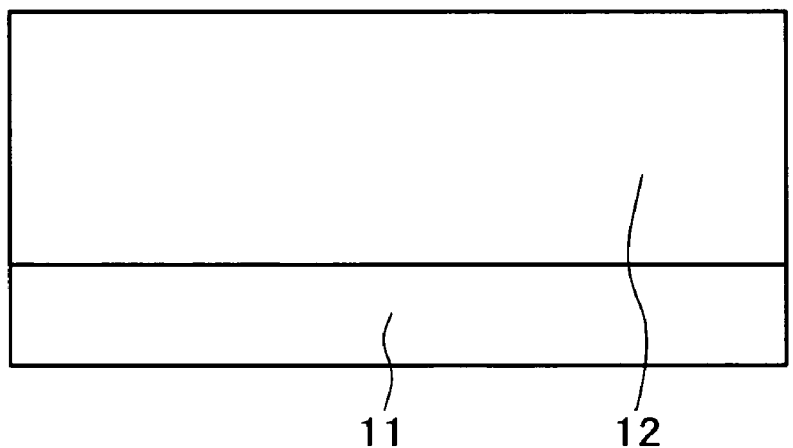
FIG. 1 is a cross-sectional view of an early stage of the fabrication process for the shallow trench isolation of the first embodiment of the present invention.

FIG. 1 is a cross-sectional view of the fabrication process at the stage of the shallow trench isolation (STI), in accordance with a first embodiment of the present invention. A silicon-germanium ($Si_{1-X}Ge_X$) layer 12 is epitaxially formed on the silicon (Si) wafer 11. At this time, a graded profile of germanium (Ge) is formed from the side of the Si wafer 11 to the top side with X (Ge content)=0 through 0.4, and the stress generated by the difference in lattice spacing between Si and $Si_{1-X}Ge_X$ is gradually alleviated. The $Si_{1-X}Ge_X$ layer 12 must have a thickness of approximately 2 to 3 micrometers in order to form an $Si_{1-X}Ge_X$ surface with the stress relieved on the top side. However, if the stress on the silicon-germanium layer is relieved then there are no restrictions on the germanium profile or layer forming method.

Figure 2:
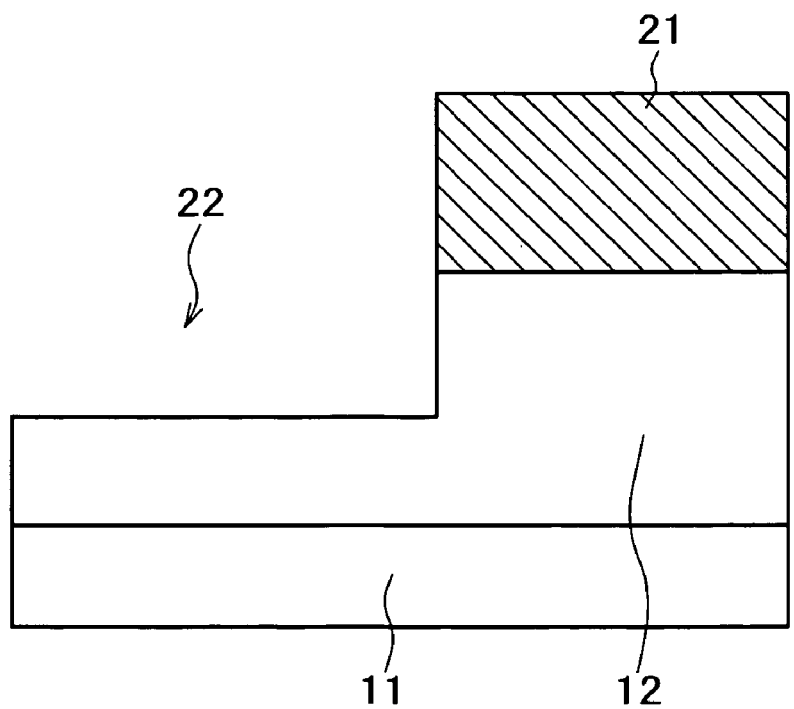
FIG. 2 is a cross-sectional view of the next step of the fabrication process in FIG. 1.

FIG. 2 is a cross-sectional view of the fabrication process as a trench 22 is formed in the $Si_{1-X}Ge_X$ layer 12 using the asymmetric dry etching technology and a lithography process with photoresist 21, in accordance with a first embodiment of the present invention. A silicon capping layer of approximately 1 to 20 nanometers may be formed as a surface protection layer on the surface of this $Si_{1-X}Ge_X$ layer 12. The trench 22 is approximately 0.2 through 0.4 micrometers deep and both the side walls and bottom of the trench 22 are formed within the $Si_{1-X}Ge_X$ layer 12.

Figure 3:
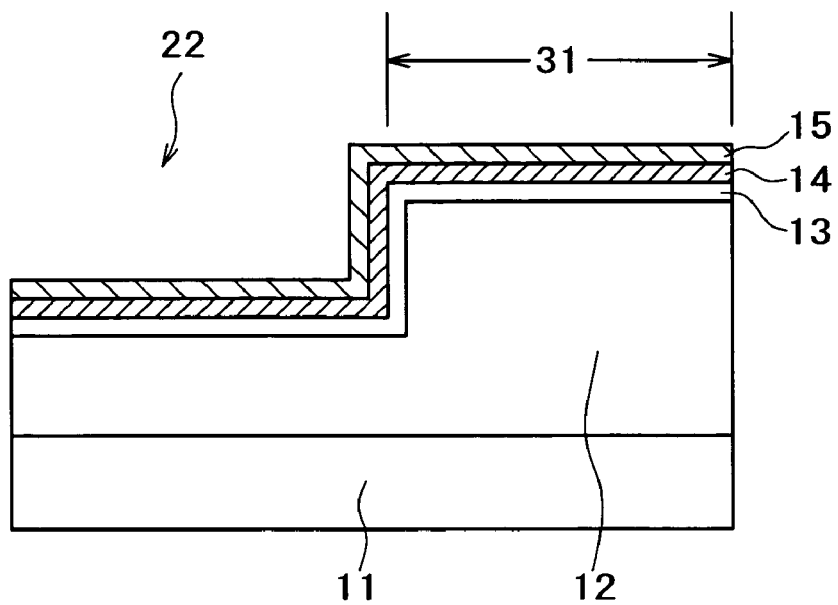
FIG. 3 is a cross-sectional view of the next step of the fabrication process in FIG. 2.

FIG. 3 is a cross-sectional view of the fabrication process as a silicon layer 13 is formed after removal of the photoresist 21 by the ashing process and cleaning process, in accordance with a first embodiment of the present invention. The silicon layer 13 is first of all epitaxially formed in a thickness of 10 to 30 nanometers over the entire surface of the $Si_{1-X}Ge_X$ layer 12 including within the trench 22. A strained silicon layer 13 subjected to tensile strain is formed in this way. Both the active region 31 forming the source-drain layer and channels of the transistor and the shallow trench isolation structure in the shallow trench 22 are formed from this silicon layer 13 so each of these may require a different optimal layer thickness. This layer thickness may be decreased down to 2 nanometers when later on adjusting the layer thickness of active region 31 by selective epitaxial development. The surface of the silicon layer 13 is next oxidized from 1 to 10 nanometers to form a layer of silicon dioxide 14 over the entire surface of the wafer. If even one nanometer of silicon layer 13 remains after oxidizing at this time, the $Si_{1-X}Ge_X$ layer 12 below it will not be oxidized so this range is optimal for the oxidizing layer.

The silicon nitride layer 15 is next deposited in a thickness of approximately 20 nanometers. The silicon dioxide 14 functions both as a stopping layer when later removing the silicon nitride layer 15 for the active layer 14 and also as a sacrificial oxide layer when forming the gate insulator. At the same time, however, the silicon dioxide 14 also achieves low current leakage in the shallow trench isolation structure by functioning as an oxidizing layer that covers the inside of the shallow trench 22. The silicon layer 13 covers the entire surface of the $Si_{1-X}Ge_X$ layer 12 so no unstable germanium oxide is formed during oxidation and no impurities from the oxidation furnace occur due to the germanium.

Figure 4:
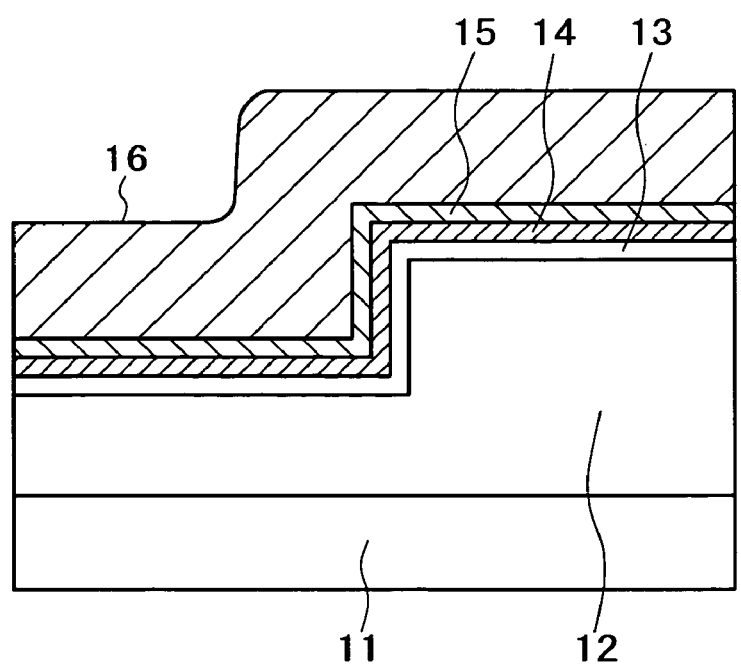
FIG. 4 is a cross-sectional view of the next step of the fabrication process in FIG. 3.

FIG. 4 is a cross-sectional view of the fabrication process as a silicon dioxide layer 16 is deposited from 0.25 to 0.5 micrometers by the CVD method, in accordance with a first embodiment of the present invention.

Figure 5:
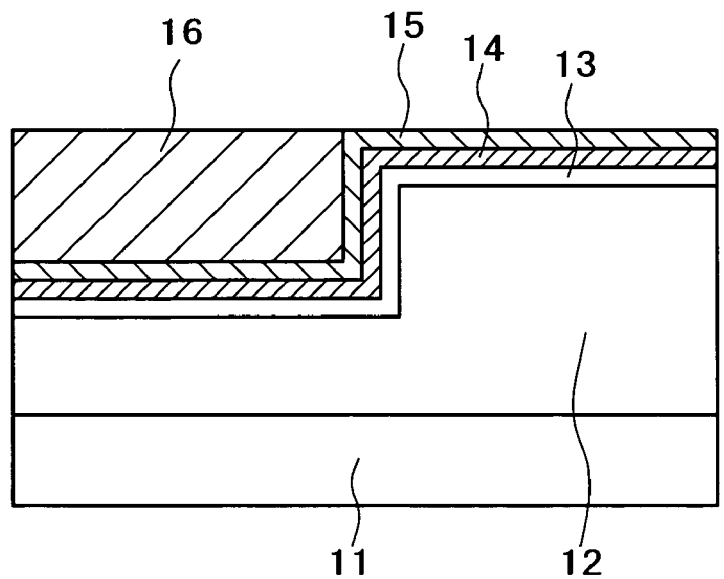
FIG. 5 is a cross-sectional view of the next step of the fabrication process in FIG. 4.

FIG. 5 is cross-sectional view of the fabrication process after leveling by the CMP method, in accordance with a first embodiment of the present invention.

Figure 6:
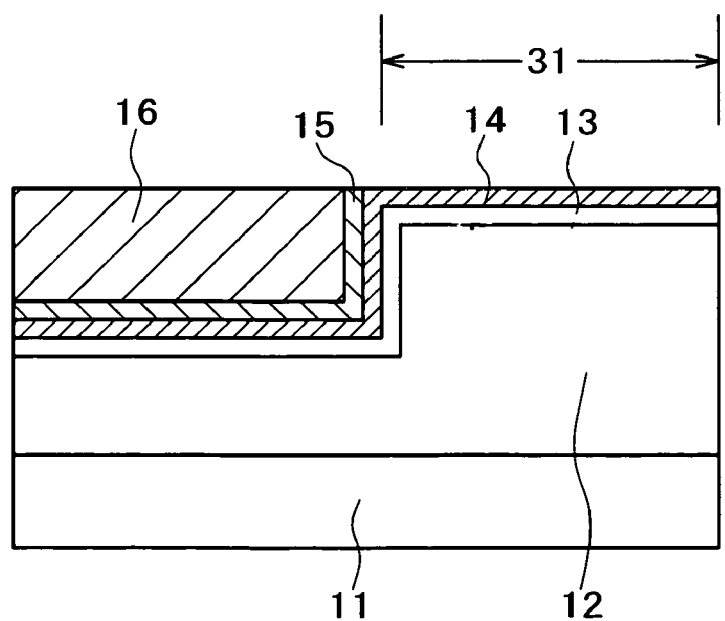
FIG. 6 is a cross-sectional view of the next step of the fabrication process in FIG. 5.

FIG. 6 is a cross-sectional view of the fabrication process after removing the silicon nitride 15 that have the function of the mechanical stopper, in accordance with a first embodiment of the present invention.

The well regions 61 are then formed as previously described. The epitaxial silicon layer is selectively formed at this stage so the thickness of the silicon layer forming the active region can be adjusted. The gate dielectric 62, gate polysilicon layer 63, gate side wall 64 and source-drain layer 65 are formed next.

Figure 7:
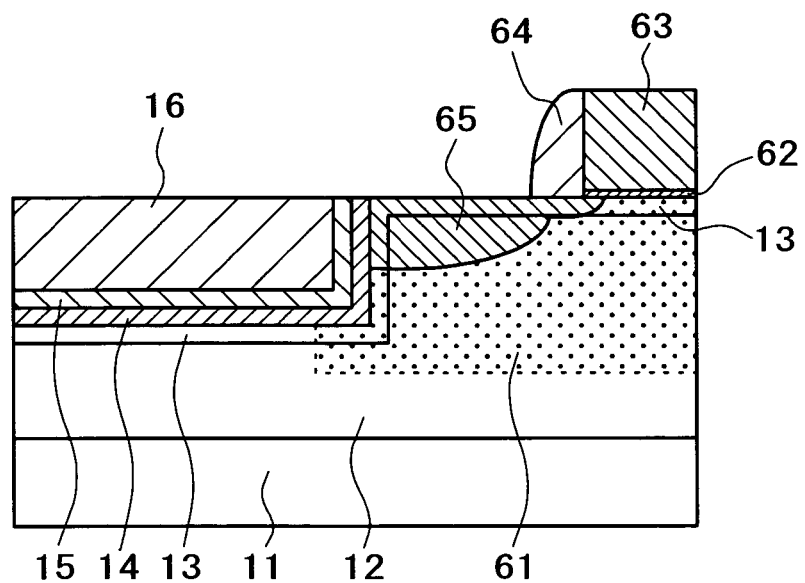
FIG. 7 is a cross-sectional view of the next step of the fabrication process in FIG. 6.

FIG. 7 is a cross-sectional view of the fabrication process after the strained silicon layer 13 for the MOS-FET channels is formed, in accordance with a first embodiment of the present invention.

Figure 8:
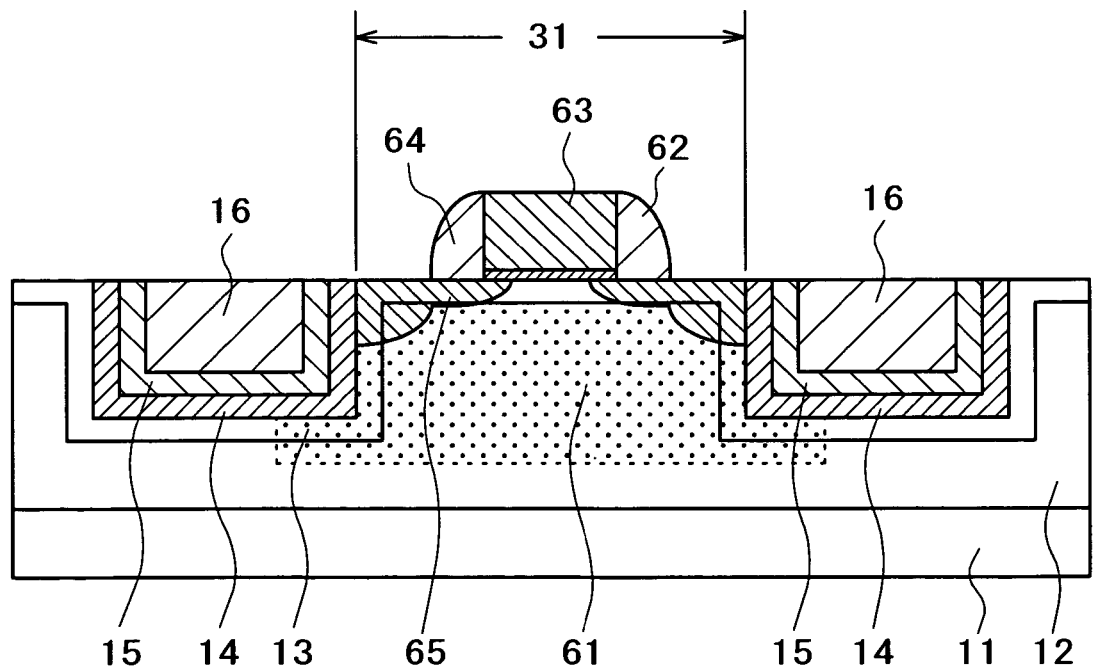
FIG. 8 is an overall cross-sectional view of a MOS-FET including the shallow trench isolation region and the active region containing the source-drain regions in the first embodiment.

FIG. 8 is a cross sectional view of the MOS-FET including the overall shallow trench device isolation region and the active region 31 including the source-drain layer, in accordance with a first embodiment of the present invention. In the MOS-FET structure of the present embodiment, the section where the shallow trench isolation and pn-junction (which is formed from the source-drain layer 65 and well regions 61) make contact with the stable silicon dioxide 14 obtained by oxidizing the epitaxially formed silicon layer 13. Accordingly, the same degree of low current leakage can be obtained as that of conventional MOS-FET devices not using silicon-germanium, in other words, MOS-FET devices made of silicon. Since the silicon layer is also formed epitaxially over the entire surface of the substrate (wafer), none of the sections are polycrystalline silicon. That means the leakage current at the edge of the active region can be reduced.

Figure 40:
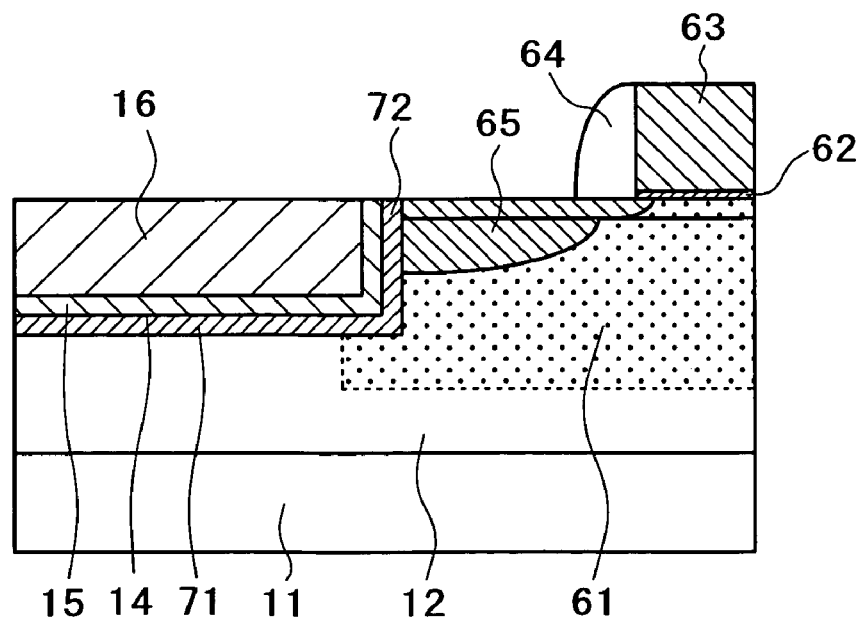
FIG. 40 is a cross-sectional view showing direct oxidation of the $Si_{1-X}Ge_X$ layer surface to complete the shallow trench isolation without performing the process to cover the surface of the $Si_{1-X}Ge_X$ layer with a silicon layer as described in processes for FIG. 2 and FIG. 3 in the first embodiment of the present invention.

In contrast, when the surface of the $Si_{1-X}Ge_X$ layer 12 as described in the processes in FIG. 2 and FIG. 3 is not covered with a silicon layer 13, the surface of $Si_{1-X}Ge_X$ layer 12 is directly oxidized. The junction leakage current increases because the pn junction is in contact with the unstable oxidized germanium 71. FIG. 40 is a cross-sectional view of the wafer when the surface of $Si_{1-X}Ge_X$ layer 12 is directly oxidized, in accordance with a first embodiment of the present invention. Leakage current might also occur since polycrystalline silicon 72 remains on the edge of the active region.

To better understand the features of the present invention, cross sectional views of essential sections among the MOS-FET device gates and the shallow trench isolation were used in FIG. 1 through FIG. 7. Descriptions from the second embodiment shown in FIG. 2, and other subsequent figures, also use cross-sectional views of essential sections among the MOS-FET device gates and shallow trench isolation. Cross-sectional views of the MOS-FET containing the entire active region and shallow trench isolation correspond to the matching sections on FIG. 8 and can be substituted into any embodiments of the present invention. So, from the following discussion omits MOS-FET sections equivalent to FIG. 8.

FIG. 9 through FIG. 15 are cross sectional views of the process for forming the shallow trench isolation, in accordance with a second embodiment of the present invention.

In this embodiment, an $Si_{1-X}Ge_X$ layer 12 is epitaxially formed from 2 to 3 micrometers on the Si wafer 11, the same as the first embodiment. By then epitaxially forming a silicon layer of 10 to 30 nanometers over the entire surface on $Si_{1-X}Ge_X$ layer 12, a strain silicon layer 81 subjected to a tensile strain is formed to constitute the channel layer. The surface is oxidized of silicon layer 81 from 1 to 10 nanometers over the entire substrate (wafer) surface.

Figure 9:
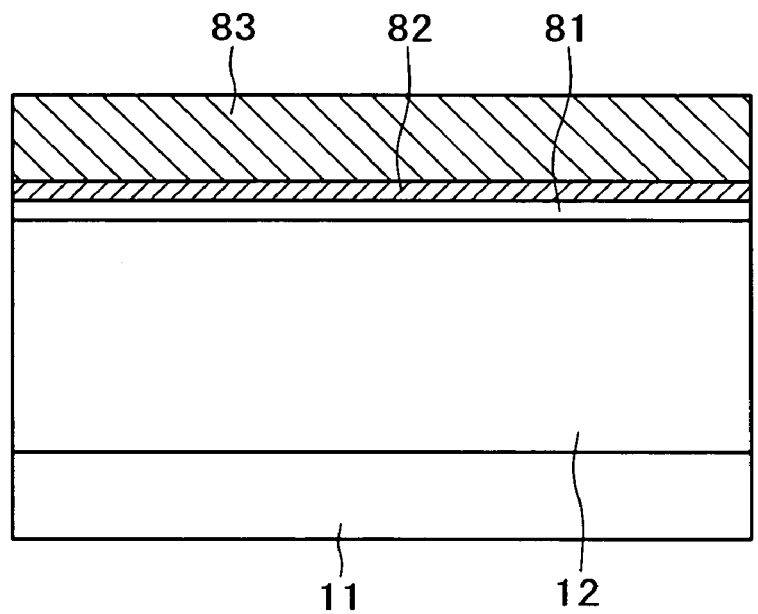
FIG. 9 is a cross-sectional view of the fabrication process for the shallow trench device isolation in the second embodiment of the present invention.

FIG. 9 is a cross-sectional view of the fabrication process after a silicon nitride layer 83 is deposited to approximately 140 nanometers by the CVD method, in accordance with a second embodiment of the present invention.

Figure 10:
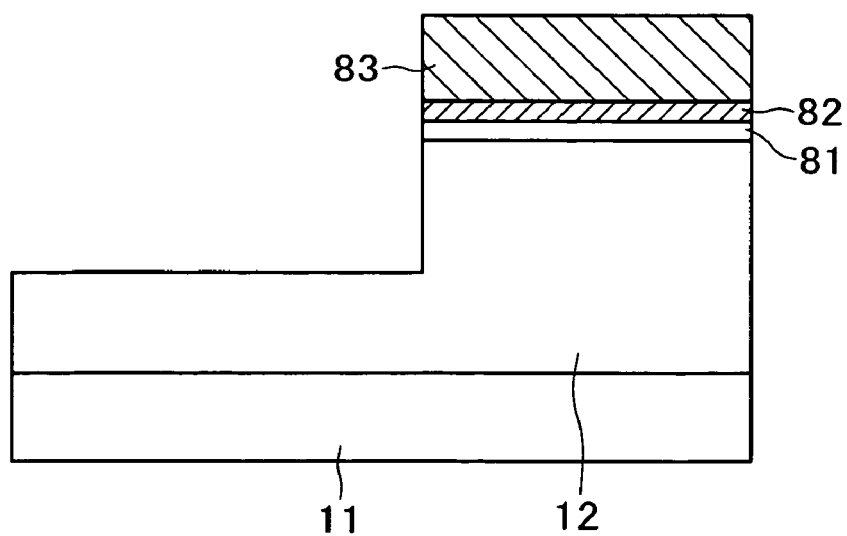
FIG. 10 is a cross-sectional view of the next step of the fabrication process in FIG. 9.

FIG. 10 is a cross-sectional view of the fabrication process after the silicon nitride layer 83 and silicon dioxide layer 82 are processed by lithography and asymmetric dry etching, in accordance with a second embodiment of the present invention. A shallow trench 22 is next formed to a depth of 0.2 to 0.4 micrometers within the laminated structure of the silicon layer 81 and the $Si_{1-X}Ge_X$ layer 12 (A laminated structure of this type is hereafter expressed simply as Si layer 81/$Si_{1-X}Ge_X$ layer 12 in order from the top surface.).

Figure 11:
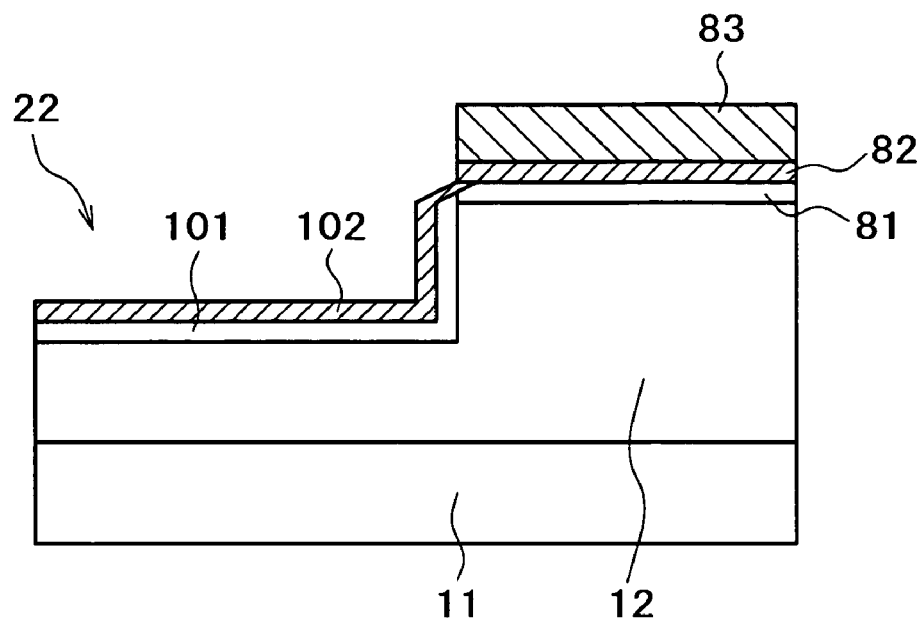
FIG. 11 is a cross-sectional view of the next step of the fabrication process in FIG. 10.

After the washing process, a silicon layer 101 is selectively formed epitaxially from 2 to 10 nanometers inside the trench, as shown in FIG. 11.

FIG. 11 is a cross-sectional view of the fabrication process after the surface of the silicon layer 101 is oxidized and a silicon dioxide layer 102 is formed on the bottom and side wall within the trench, in accordance with a second embodiment of the present invention. This silicon dioxide layer 102 layer functions as an oxidizing layer covering the inside of the trench 22 to achieve a shallow trench isolation structure with little leakage current. The exposed portions of the $Si_{1-X}Ge_X$ layer 12 inside the trench are all covered by the silicon layer 101 so that no unstable oxidized germanium is formed during the oxidation process and no impurities occur from the oxidation furnace due to the germanium.

Figure 12:
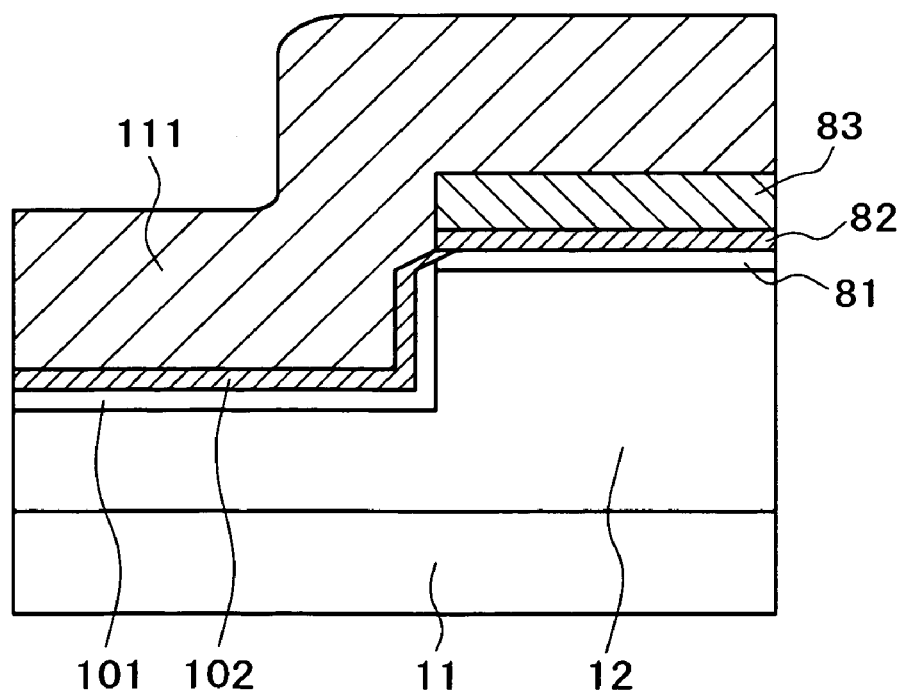
FIG. 12 is a cross-sectional view of the next step of the fabrication process in FIG. 11.

FIG. 12 is a cross-sectional view of the fabrication process after a silicon dioxide 111 layer is deposited in a thickness of 0.25 to 0.5 micrometers using the CVD method, in accordance with a second embodiment of the present invention.

Figure 13:
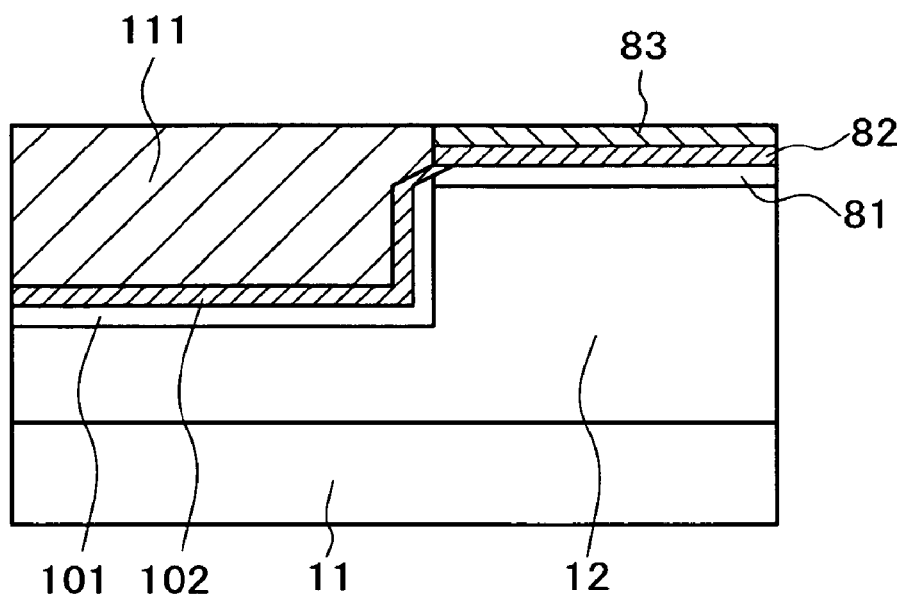
FIG. 13 is a cross-sectional view of the next step of the fabrication process in FIG. 12.

FIG. 13 is a cross-sectional view of the fabrication process after leveling is performed by the CMP method, in accordance with a second embodiment of the present invention.

Figure 14:
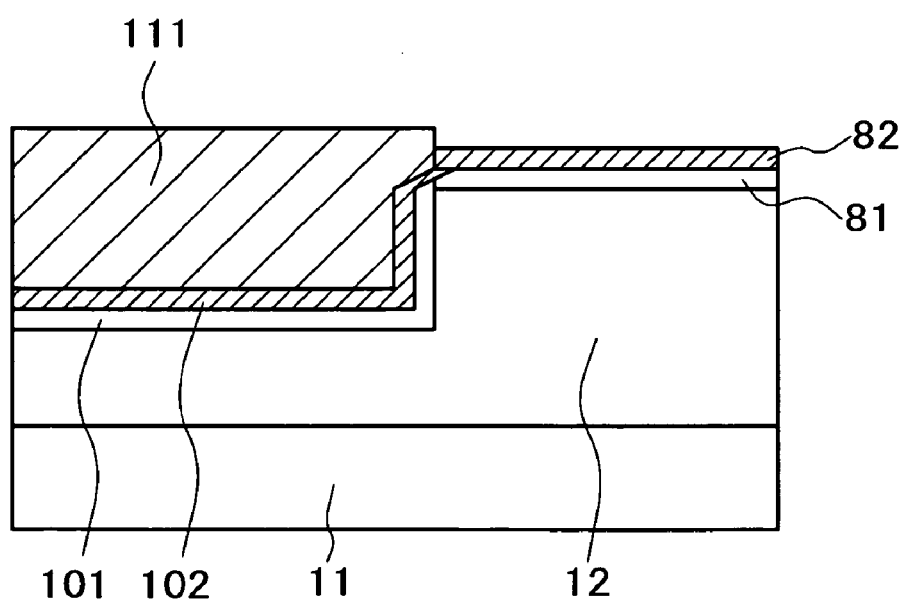
FIG. 14 is a cross-sectional view of the next step of the fabrication process in FIG. 13.

FIG. 14 is a cross-sectional view of the fabrication process after the silicon nitride layer 83 forming the mechanical stopper is removed by wet etching, in accordance with a second embodiment of the present invention. The step between the silicon dioxide layer 111 formed by the CVD method and the silicon dioxide 82 layer formed by thermal oxidizing during removal of the silicon dioxide layer 82 is leveled (planarized) enough to eliminate effects from the step due to a difference in etching rates between the oxidized layers and the shallow trench isolation structure thus formed.

Figure 15:
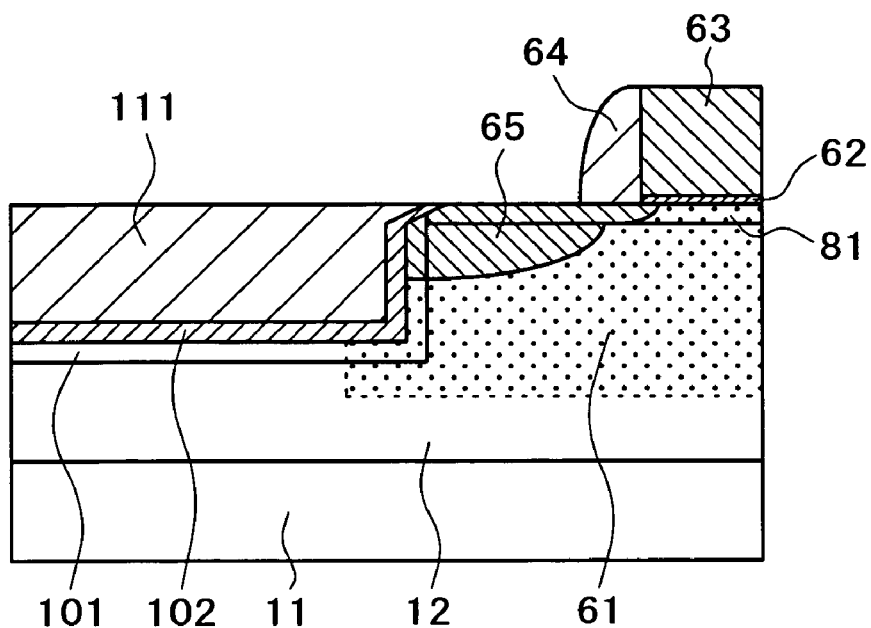
FIG. 15 is a cross-sectional view of the next step of the fabrication process in FIG. 14.

FIG. 15 is a cross-sectional view of the fabrication process after the well region 61, gate dielectric 62, gate polysilicon layer 63, gate side wall 64 and source-drain region 65 are formed, and after the MOS-FET is formed with channels made from the strain silicon layer 81, in accordance with a second embodiment of the present invention.

In the MOS-FET structure of the present embodiment, the section where the pn junction formed from the source-drain region 65 and the well region 61 contacts the shallow trench isolation structure is in contact with the stable silicon dioxide layer 102 layer obtained from epitaxially developed oxidized silicon so that low current leakage equivalent to a MOS-FET of the related art not utilizing silicon-germanium can be obtained. The silicon layer is formed epitaxially in selected sections so there are no sections are polycrystalline silicon and the leakage current in the active region can be reduced.

The active region of the selectively formed epitaxial silicon layer 101 spreads out further than the edge of the silicon nitride layer 83 that determines the position of the essential active region. This allows reducing the amount that surface of the silicon dioxide 111 layer filling the isolation trench, will fall below the active region through trimming while undergoing the washing process, etc. When the active region has an oxidized surface depression (or recess) of this type, a leakage current will flow across the well region 61 and source-drain region 65 by way of silicide, etc. The MOS-FET structure of the present embodiment therefore has the effect of reducing this type of leakage current.

The method for fabricating the shallow trench isolation structure of a third embodiment is described next while referring to FIG. 9, FIG. 10, and FIG. 16 through FIG. 21.

In this embodiment, a $Si_{1-X}Ge_X$ layer 12 is epitaxially formed from 2 to 3 micrometers to relieve the strain on the Si substrate 11 the same as performed in the first embodiment. A silicon layer is then epitaxially formed from 10 to 30 nanometers over the entire surface of the $Si_{1-X}Ge_X$ layer 12 so that the strained silicon layer 81 is subjected to a tensile strain.

The surface of the silicon layer 81 is oxidized from 1 to 10 nanometers and the silicon dioxide layer 82 is formed over the entire wafer surface. The silicon nitride layer 83 is then deposited to approximately 140 nanometers by the CVD method the same as in the second embodiment (See FIG. 9).

The silicon nitride layer 83 and silicon dioxide layer 82 are next processed by lithography and asymmetric dry etching. A shallow trench 22 is next formed to a depth of 0.2 to 0.4 micrometers within the Si layer 81/$Si_{1-X}Ge_X$ layer 12 the same as in the second embodiment (See FIG. 10).

An silicon layer 171a is next epitaxially formed from 2 to 10 nanometers in the shallow trench 22 after undergoing the washing process. An silicon layer cannot be epitaxially formed on the side walls of the silicon dioxide layer 82, and surface and side walls of the silicon nitride layer 83 so polycrystalline silicon 171b is deposited, as shown in FIG. 16.

Figure 16:
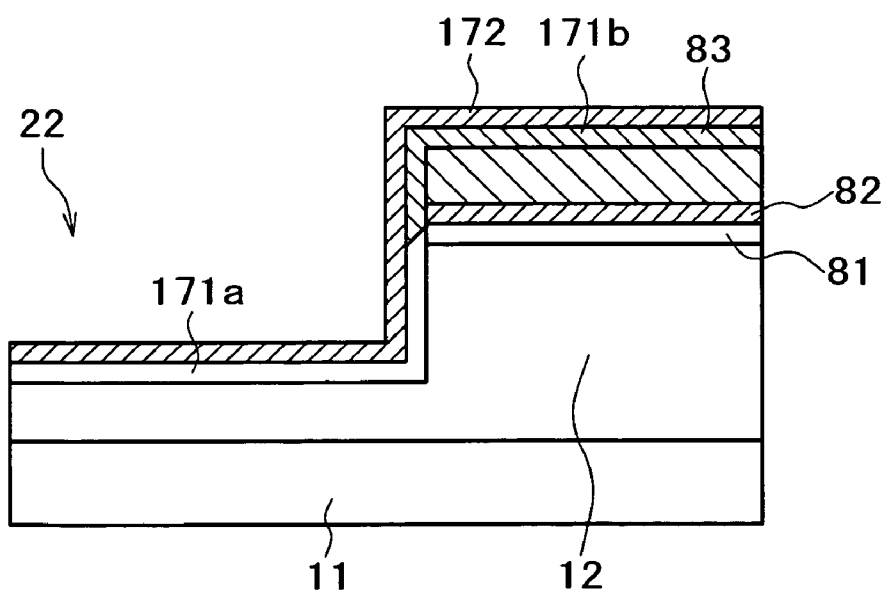
FIG. 16 is a cross-sectional view of the fabrication process for the shallow trench isolation of the third embodiment of the present invention.

FIG. 16 is a cross-sectional view of the fabrication process after the surfaces of the silicon layer 171a and the polycrystalline silicon 171b are oxidized from 1 to 10 nanometers forming a silicon dioxide 172 layer over the entire surface of the wafer, in accordance with a third embodiment of the present invention. This silicon dioxide 172 layer functions as an oxidizing layer covering the inside of the trench 22 to achieve a shallow trench isolation structure with little leakage current. The exposed portions of the $Si_{1-X}Ge_X$ layer 12 inside the trench are all covered by the silicon layer 171 so that no unstable oxidized germanium is formed during the oxidation process and no impurities occur to the oxidation furnace due to the germanium.

Figure 17:
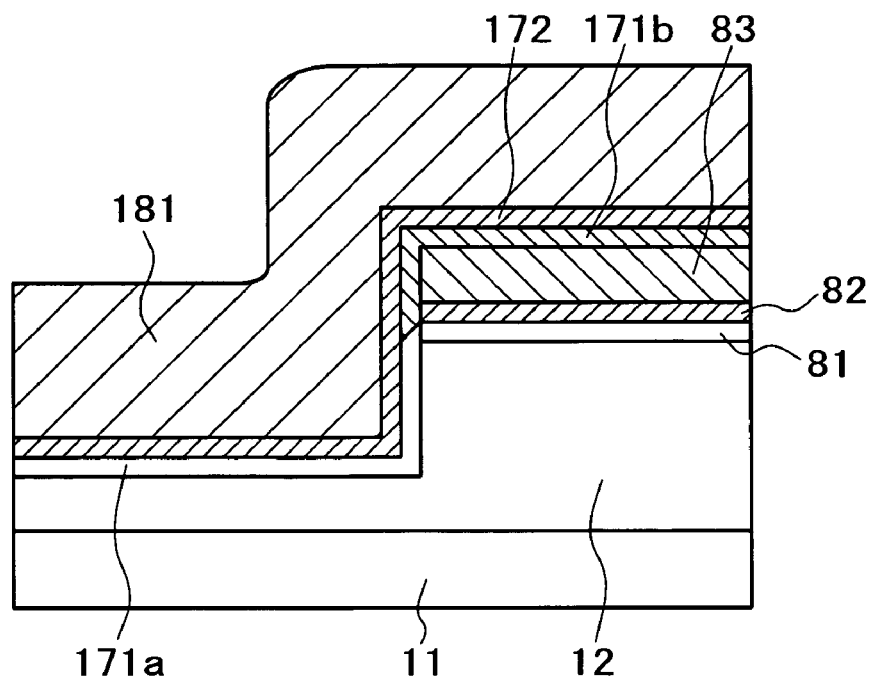
FIG. 17 is a cross-sectional view of the next step of the fabrication process in FIG. 16.

FIG. 17 is a cross-sectional view of the fabrication process after a silicon dioxide 181 layer is deposited in a thickness of 0.25 to 0.5 micrometers using the CVD method, in accordance with a third embodiment of the present invention.

Figure 18:
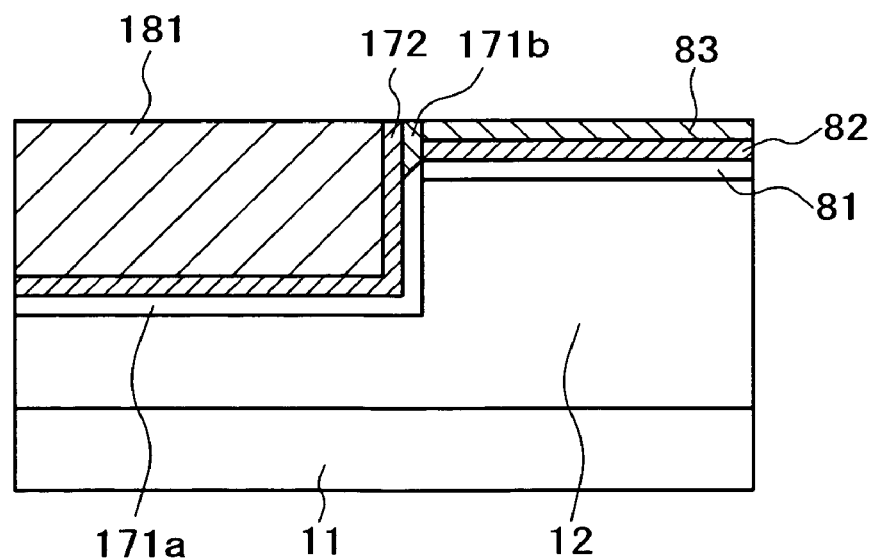
FIG. 18 is a cross-sectional view of the next step of the fabrication process in FIG. 17.

FIG. 18 is a cross-sectional view of the fabrication process after leveling by the CMP method and removal of the silicon nitride layer 83 forming the mechanical stopper are performed, in accordance with a third embodiment of the present invention.

Figure 19:
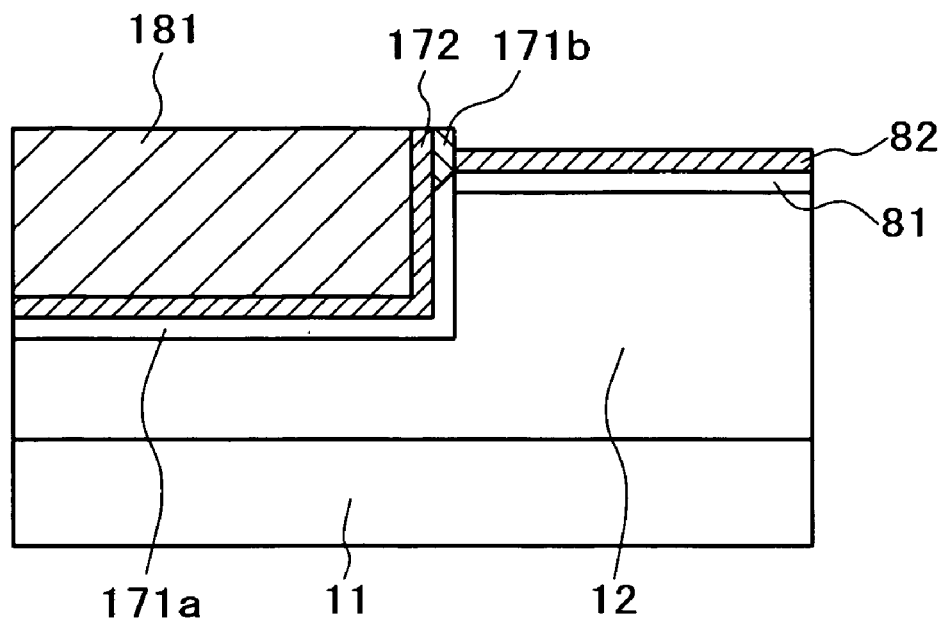
FIG. 19 is a cross-sectional view of the next step of the fabrication process in FIG. 18.

FIG. 19 is a cross-sectional view of the fabrication process as the polycrystalline silicon 171b still remains at the boundary of the shallow trench and channel region, in accordance with a third embodiment of the present invention.

Figure 20:
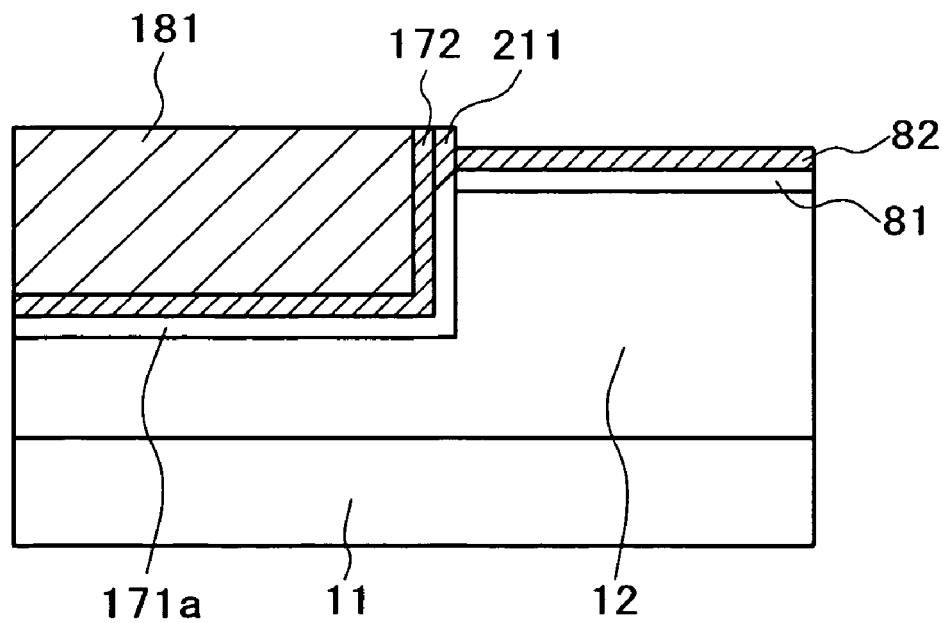
FIG. 20 is a cross-sectional view of the next step of the fabrication process in FIG. 19.

FIG. 20 is a cross-sectional view of the fabrication process after section 171b is oxidized in an oxidative atmosphere to form an oxide layer 211, in accordance with a third embodiment of the present invention. Alternatively, section 171b may be oxidized prior to removal of the silicon nitride layer 83 to prevent the silicon layer 81 from oxidizing. Current leakage at the channel edge along the direction of gate width (STI edge) can in this way be reduced and a shallow trench isolation structure with satisfactory insulation characteristics formed.

Figure 21:
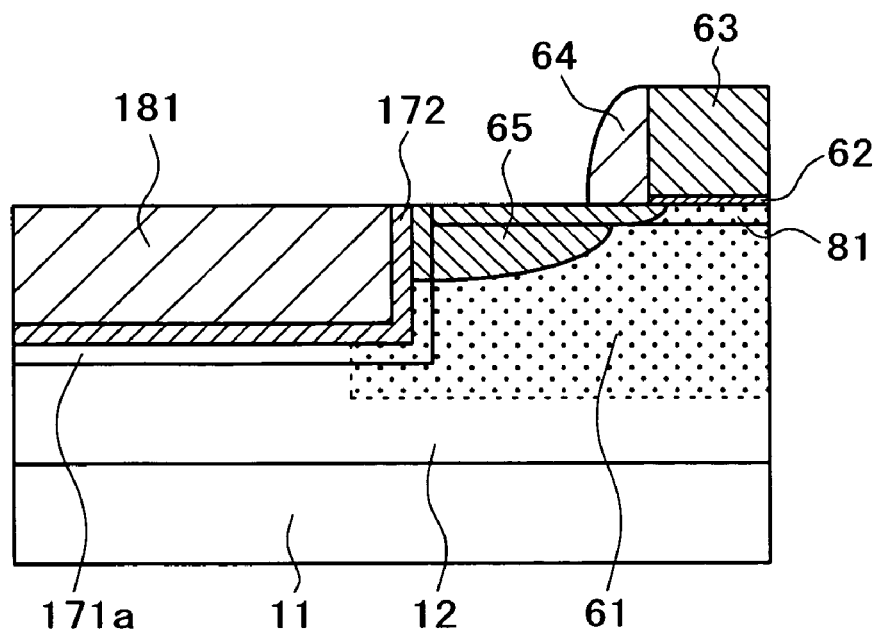
FIG. 21 is a cross-sectional view of the next step of the fabrication process in FIG. 19.

FIG. 21 is a cross-sectional view of the fabrication process after the well region 61, gate dielectric 62, gate polysilicon layer 63, gate side wall 64 and the source-drain region 65 are formed, and the MOS-FET is formed with channels made from the strain silicon layer 81, in accordance with a third embodiment of the present invention.

The step between the silicon dioxide 181, 172, 211 layers and the silicon dioxide layer 82 remaining from the process in FIG. 20 is leveled (planarized) during removal of the silicon dioxide layer 82 by wet etching to sufficiently eliminate effects from the step due to a difference in etching rates in the oxidized layers.

In the MOS-FET structure of the present embodiment, the section where the pn junction formed from the source-drain region 65 and the well region 61 contacts the shallow trench isolation structure is in contact with the stable silicon dioxide 172 layer obtained from epitaxially formed oxidized silicon. Accordingly, low current leakage equivalent to a conventional MOS-FET not utilizing silicon-germanium can be obtained. The polycrystalline silicon 171b deposited simultaneously with the epitaxial formation is removed by oxidizing so that leakage current at the edges of the active region can be reduced.

The method for fabricating the shallow trench isolation of the fourth embodiment is described next while referring to FIG. 9 and FIG. 22 through FIG. 29.

In this embodiment, a $Si_{1-X}Ge_X$ layer 12 is epitaxially formed from 2 to 3 micrometers on the Si substrate 11 to relieve the strain, the same as in the first embodiment. A silicon layer is then epitaxially formed from 10 to 30 nanometers over the entire surface of the $Si_{1-X}Ge_X$ layer 12 to form a strained silicon layer 81 comprising a channel layer subjected to tensile strain. The surface of the silicon layer 81 is oxidized from 1 to 10 nanometers and the silicon dioxide layer 82 formed over the entire wafer surface. The silicon nitride layer 83 is then deposited to approximately 140 nanometers by the CVD method (See FIG. 9).

Figure 22:
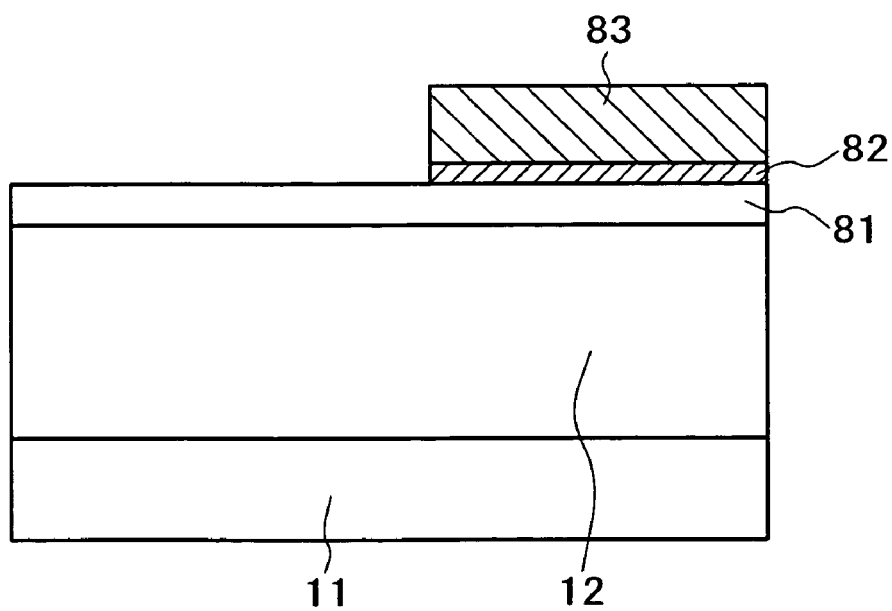
FIG. 22 is a cross-sectional view of the fabrication process of the shallow trench isolation of the fourth embodiment of the present invention.

FIG. 22 is a cross-sectional view of the fabrication process after the silicon nitride layer 83 and silicon dioxide layer 82 are processed by lithography and asymmetric dry etching, in accordance with a fourth embodiment of the present invention.

After next depositing a silicon dioxide layer from 10 to 30 nanometers by the CVD method, the deposited portion of layer thickness is removed by asymmetric dry etching.

Figure 23:
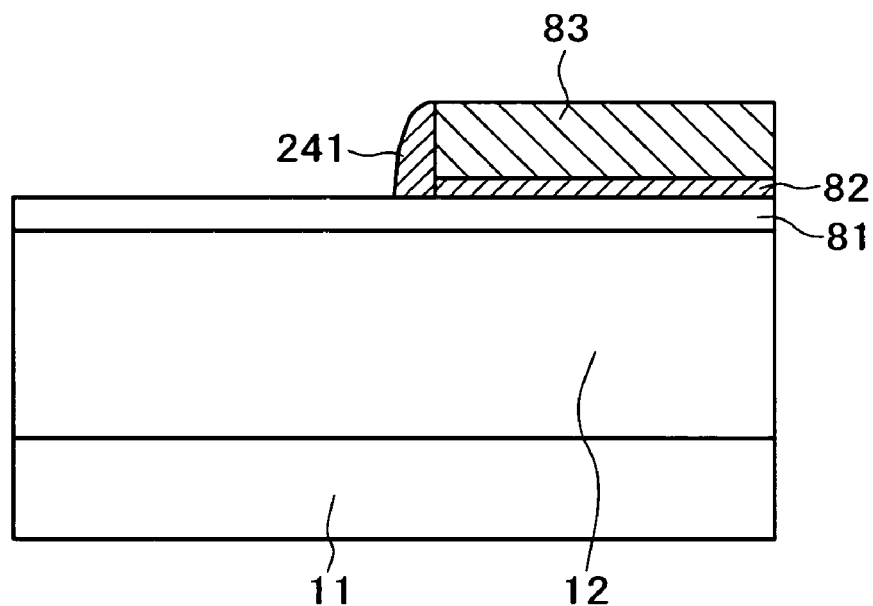
FIG. 23 is a cross-sectional view of the next step of the fabrication process in FIG. 22.

FIG. 23 is cross-sectional view of the fabrication process showing the silicon dioxide 241 layer remaining only on the side walls of the silicon nitride layer 83, in accordance with a fourth embodiment of the present invention.

Figure 24:
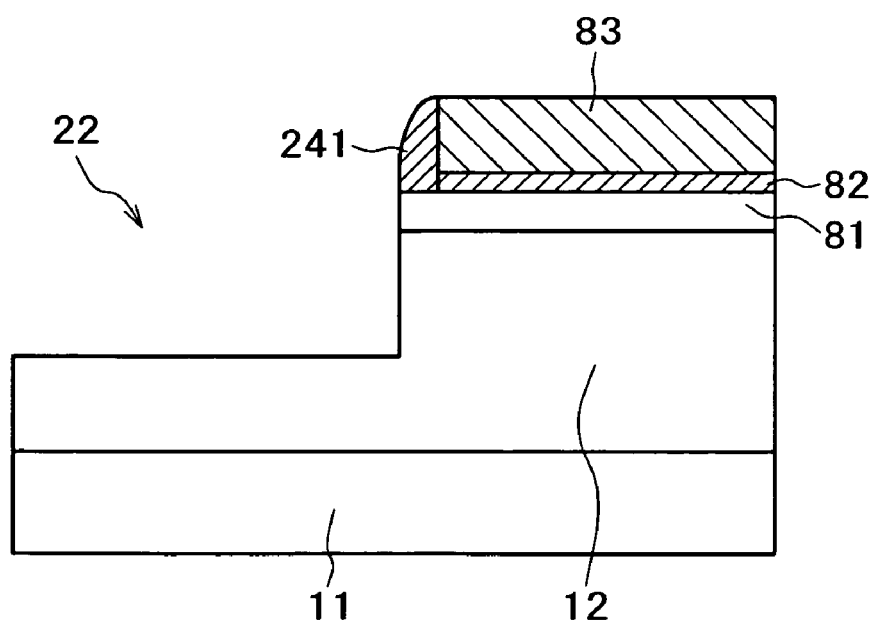
FIG. 24 is a cross-sectional view of the next step of the fabrication process in FIG. 23.

FIG. 24 is a cross-sectional view of the fabrication process after a shallow trench 22 is formed to a depth of 0.2 to 0.4 micrometers within the silicon layer 81/$Si_{1-X}Ge_X$ layer 12, in accordance with a fourth embodiment of the present invention.

Figure 25:
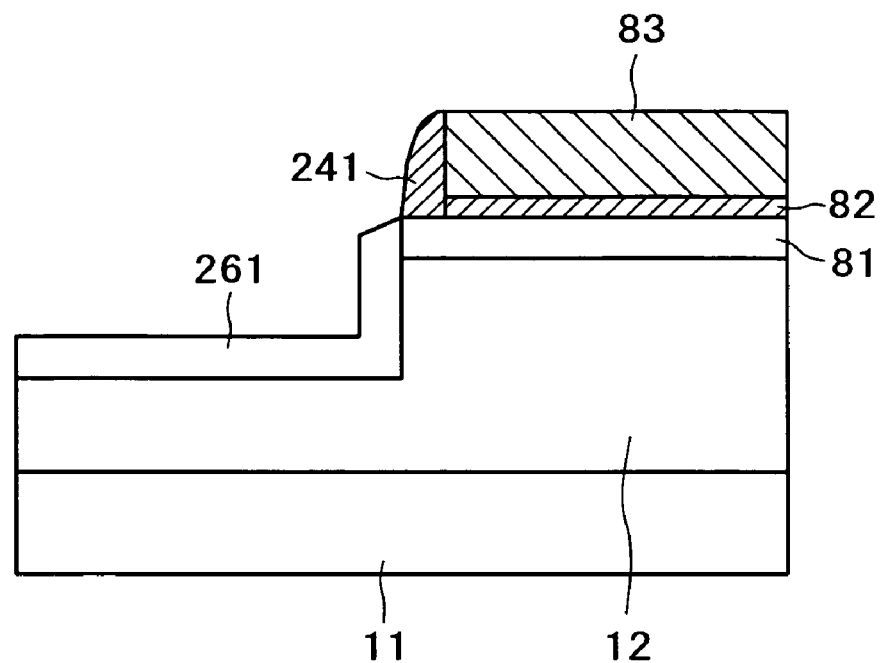
FIG. 25 is a cross-sectional view of the next step of the fabrication process in FIG. 24.

FIG. 25 is a cross-sectional view of the fabrication process after undergoing the washing process and a silicon layer 261 is epitaxially formed from 2 to 10 nanometers selectively within the shallow trench, in accordance with a fourth embodiment of the present invention.

Figure 26:
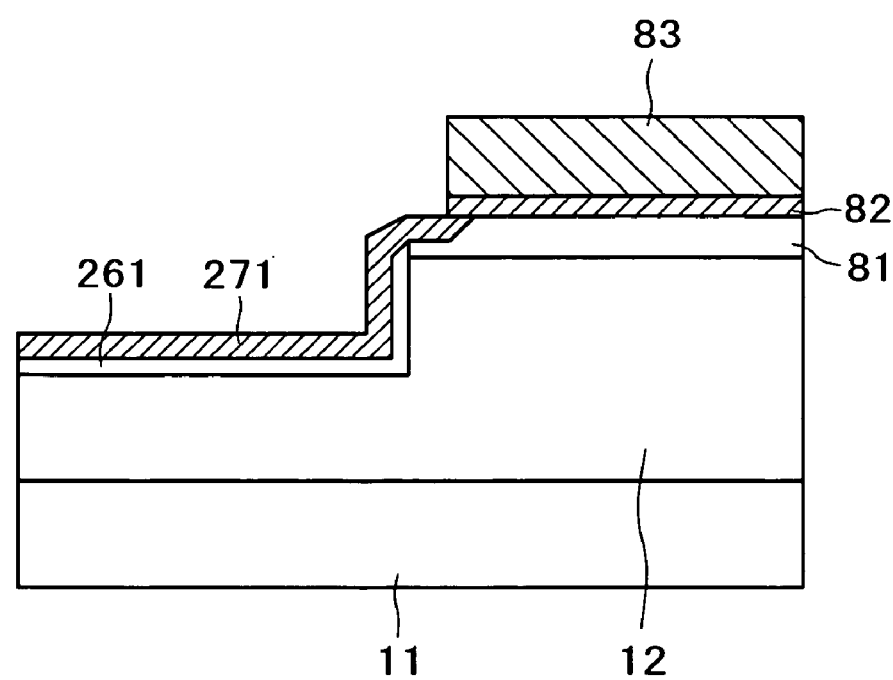
FIG. 26 is a cross-sectional view of the next step of the fabrication process in FIG. 25.

FIG. 26 is a cross-sectional view of the fabrication process after wet etching is performed for 3 to five minutes with 0.5 percent HF solution to selectively remove the silicon dioxide layer 241, in accordance with a fourth embodiment of the present invention. The surface of the silicon layers 261 and silicon layers 81 are then oxidized in an oxidative atmosphere to form a silicon dioxide layer 271. The selective epitaxial growth of the silicon layer may instead be performed after removing the silicon dioxide layer 241 by wet etching.

By using the oxidizing processes in this way, the shape of the section of the silicon layer forming the active region section in the vicinity of the shallow trench can be made circular, and leakage current can be reduced by crowding the gate electric field. The silicon dioxide layer 271 functions as an oxidizing layer covering the interior of the trench so that low current leakage in the shallow trench isolation is achieved.

The exposed portions of the $Si_{1-X}Ge_X$ layer 12 are all covered by the silicon layer 261 as shown in FIG. 25, so that no unstable oxidized germanium is formed during the oxidation process and no impurities occur to the oxidation furnace due to the germanium.

Figure 27:
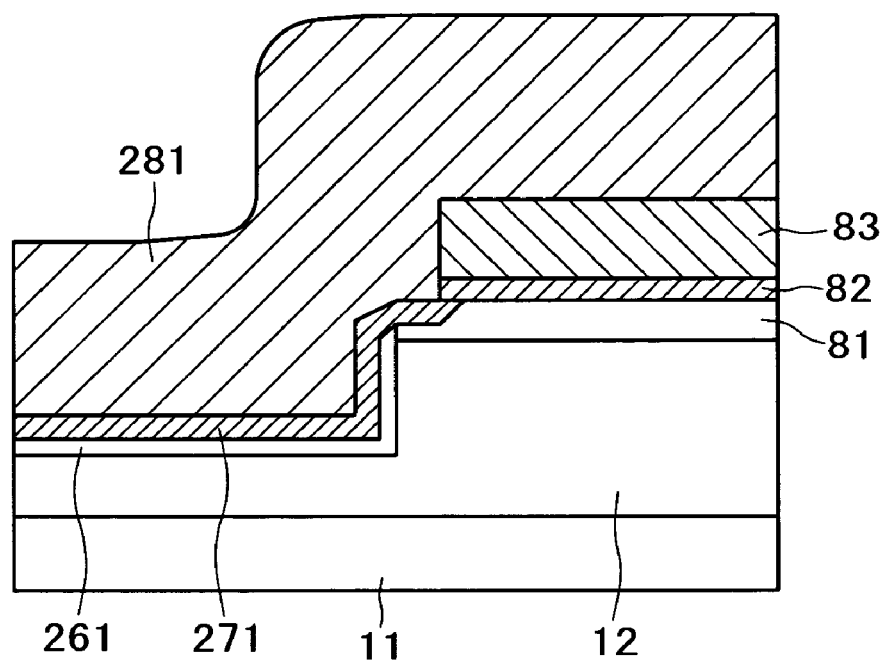
FIG. 27 is a cross-sectional view of the next step of the fabrication process in FIG. 26.

FIG. 27 is a cross-sectional view of the fabrication process after a silicon dioxide layer 281 is deposited (0.25 to 0.5 micrometers) using the CVD method, in accordance with a fourth embodiment of the present invention.

Figure 28:
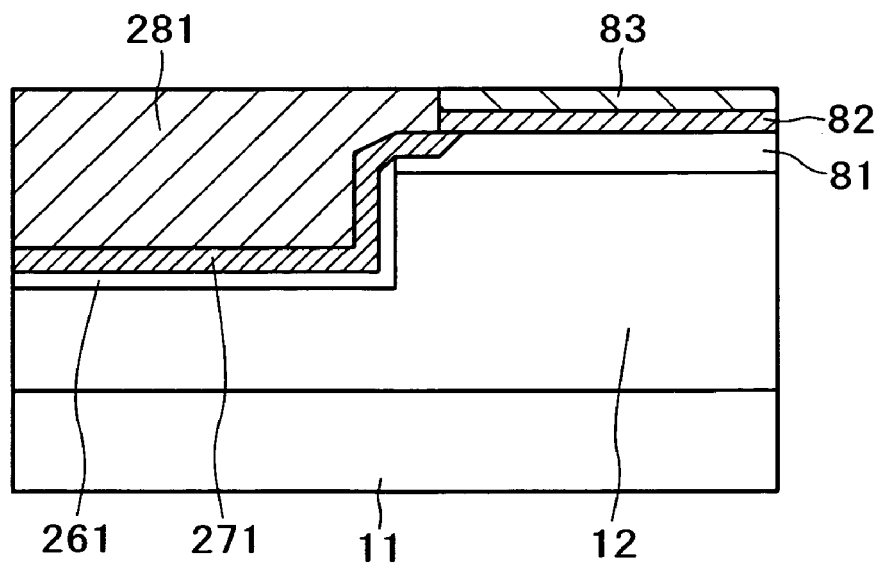
FIG. 28 is a cross-sectional view of the next step of the fabrication process in FIG. 27.

FIG. 28 is a cross-sectional view of the fabrication process after leveling is performed by the CMP method, in accordance with a fourth embodiment of the present invention. The silicon nitride layer 83 forming the mechanical stopper, and the silicon dioxide layer 82 forming the mechanical stopper are removed to form the shallow trench isolation structure.

Figure 29:
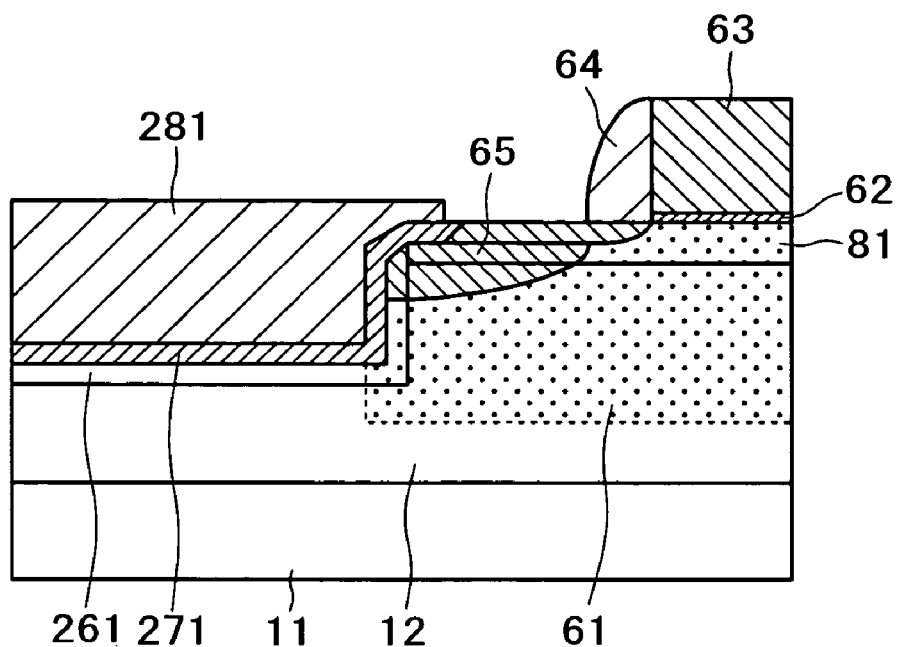
FIG. 29 is a cross-sectional view of the next step of the fabrication process in FIG. 28.

FIG. 29 is a cross-sectional view of the fabrication process after the well region 61, gate dielectric 62, gate polysilicon layer 63, gate side wall 64 and the source-drain region 65 are formed, and the MOS-FET is formed with channels made from the strain silicon layer 81, in accordance with a fourth embodiment of the present invention.

In the structure of the present embodiment, the section where the pn junction formed from the source-drain region 65 and well region 61 contacts the shallow trench isolation is in contact with the stable silicon dioxide 271 layer obtained from epitaxially formed silicon layer 261. Accordingly, low current leakage equivalent to a conventional MOS-FET not utilizing silicon-germanium can be obtained. The silicon layer 261 is selectively formed by epitaxial growth so that there are no polycrystalline silicon sections and the leakage current at the edges of the active region can be reduced.

The method for fabricating the shallow trench isolation of the fifth embodiment of the invention is described next while referring to the cross-sectional process views of FIG. 30 through FIG. 35.

A multi-layer structure of silicon-germanium layer 311, silicon dioxide layer 312, and single crystal silicon-germanium layer 313 is formed on the silicon substrate 11. This structure is formed by a bonding method or the SIMOX (Separation by Implanted Oxygen) method. This structure is referred to as the SOI (Silicon on Insulator) structure. Alternatively, in this method, the silicon layer can be used instead of the silicon-germanium layer 311. The layer thickness of the single crystal silicon-germanium layer 313 may vary within a range from 10 to 500 nanometers according to the forming method and application, but there should be no strain in the vicinity of the surface. By then epitaxially forming a silicon layer 81 of 10 to 30 nanometers over that entire surface, a channel layer subjected to tensile strain can be formed.

Figure 30:
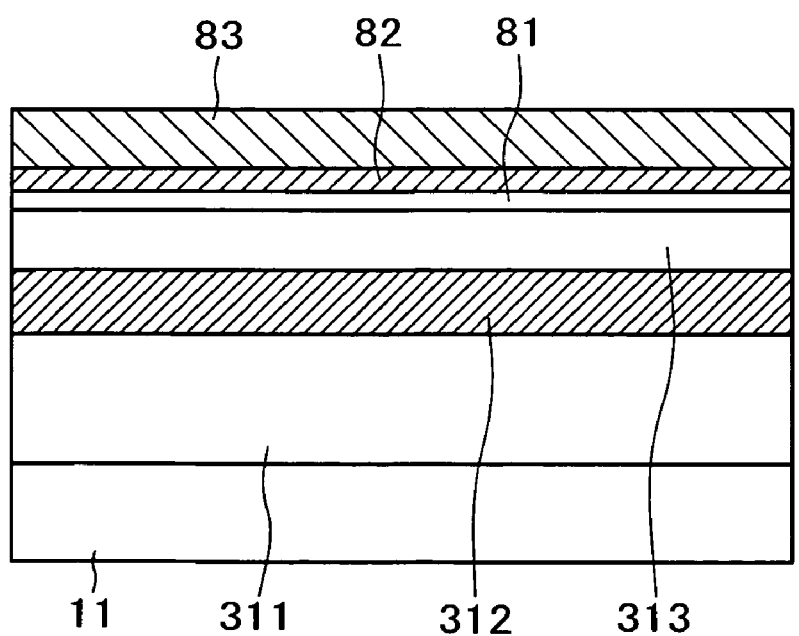
FIG. 30 is a cross-sectional view of the next step of the fabrication process for the shallow trench isolation region of the fifth embodiment of the present invention.

FIG. 30 is a cross-sectional view of the fabrication process after oxidizing the surface of the silicon layer 81 to further form a silicon dioxide layer 82 over the entire surface of the wafer and after the silicon nitride layer 83 is deposited to approximately 50 nanometers by the CVD method, in accordance with a fifth embodiment of the present invention.

Figure 31:
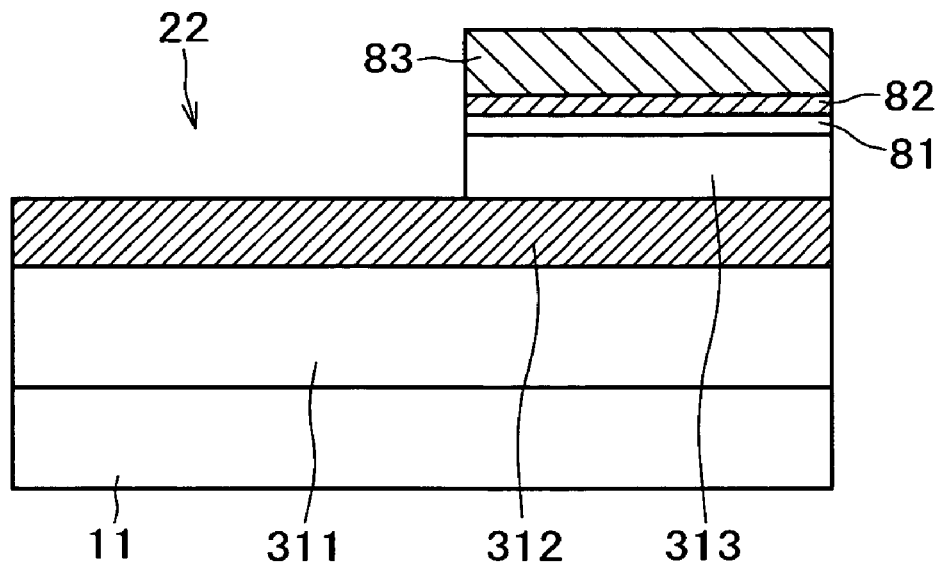
FIG. 31 is a cross-sectional view of the next step of the fabrication process in FIG. 30.

FIG. 31 is a cross-sectional view of the fabrication process after forming the silicon nitride layer 83 and silicon dioxide layer 82 by the lithography process and asymmetric dry etching, and after the silicon nitride layer 83 and silicon dioxide layer 82 are used as a mask to form the shallow trench 22 in the silicon layer 81/single crystal silicon-geranium layer 313 by asymmetric dry etching, in accordance with a fifth embodiment of the present invention.

The depth to form the trench 22 depends on the layer thickness of the single crystal silicon-geranium layer 313. The depth of trench 22 in this embodiment extends to the silicon dioxide layer 312. However, even if the trench 22 does not extend that far the only difference is the presence of the silicon dioxide layer 312 functioning as the insulator in the lower section, and a shallow trench isolation may be formed using the same methods as in the first through the fourth embodiments.

Figure 32:
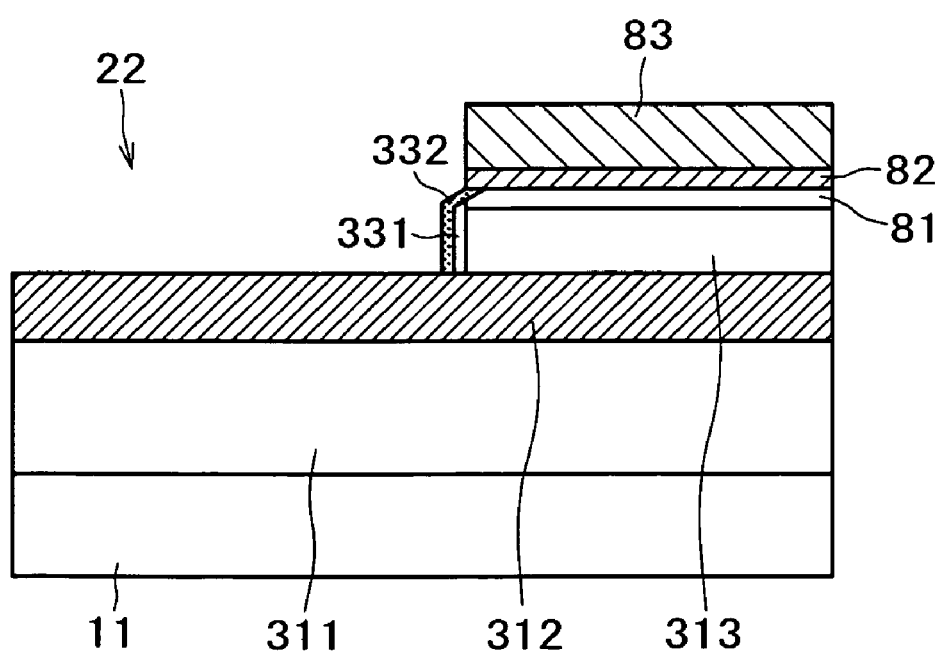
FIG. 32 is a cross-sectional view of the next step of the fabrication process in FIG. 31.

FIG. 32 is a cross-sectional view of the fabrication after undergoing the washing process, and after the silicon layer 331 is epitaxially formed on the side walls of the trench 22, in accordance with a fifth embodiment of the present invention. Next, the surface of the silicon layer 331 is oxidized from 1 to 10 nanometers in an oxidative atmosphere to form the silicon dioxide layer 332. This silicon dioxide layer 332 functions as an oxidized layer to cover the inside of the trench 22 and achieve a shallow trench isolation with low leakage current. Further, the exposed portions of the single crystal silicon-germanium layer 311 are all covered by the silicon layer 331 as shown so that no unstable oxidized germanium is formed during the oxidation process and no impurities occur from the oxidation furnace due to the germanium. Also, instead of selectively forming an epitaxial silicon layer 331, the case may be considered where by forming an epitaxial layer over the entire surface, polycrystalline silicon can be formed for example on the upper surface of the silicon nitride layer 83. In this case, the leakage current can be reduced at the edge of the active region by the same methods as the third embodiment.

Figure 33:
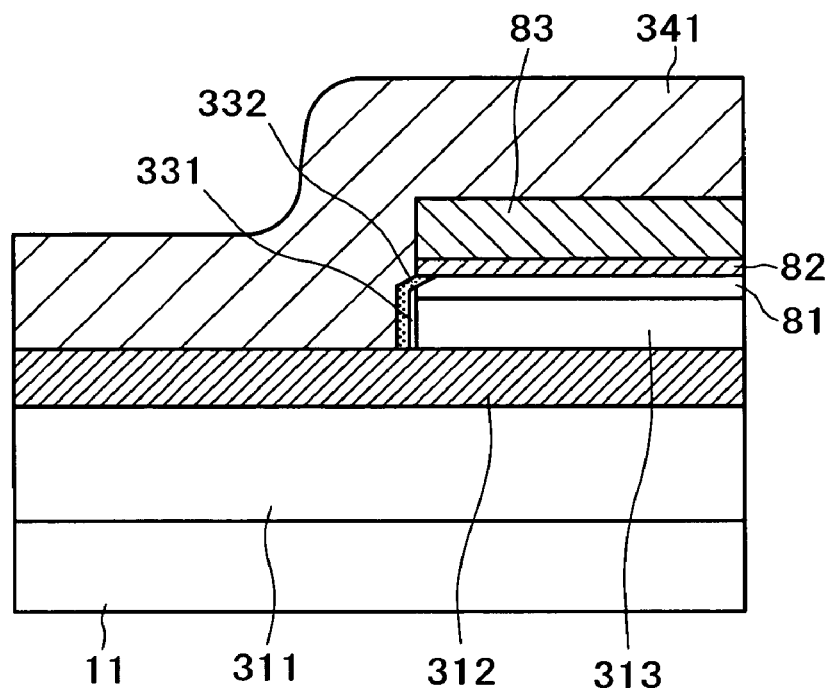
FIG. 33 is a cross-sectional view of the next step of the fabrication process in FIG. 32.

FIG. 33 is a cross-sectional view of the fabrication process after a silicon dioxide layer 341 is deposited in a thickness from 0.01 to 0.5 micrometers by the CVD method, in accordance with a fifth embodiment of the present invention.

Figure 34:
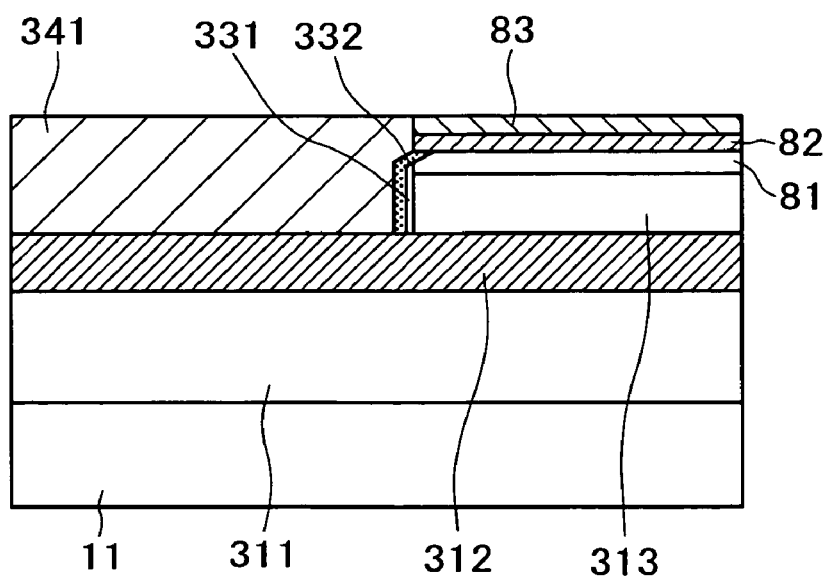
FIG. 34 is a cross-sectional view of the next step of the fabrication process in FIG. 33.

FIG. 34 is a cross-sectional view of the fabrication process after leveling is performed by the CMP method and the silicon nitride layer 83 forming the mechanical stopper is removed, in accordance with one embodiment of the present invention. The silicon dioxide layer 82 is also removed by etching to form the shallow trench isolation structure.

Figure 35:
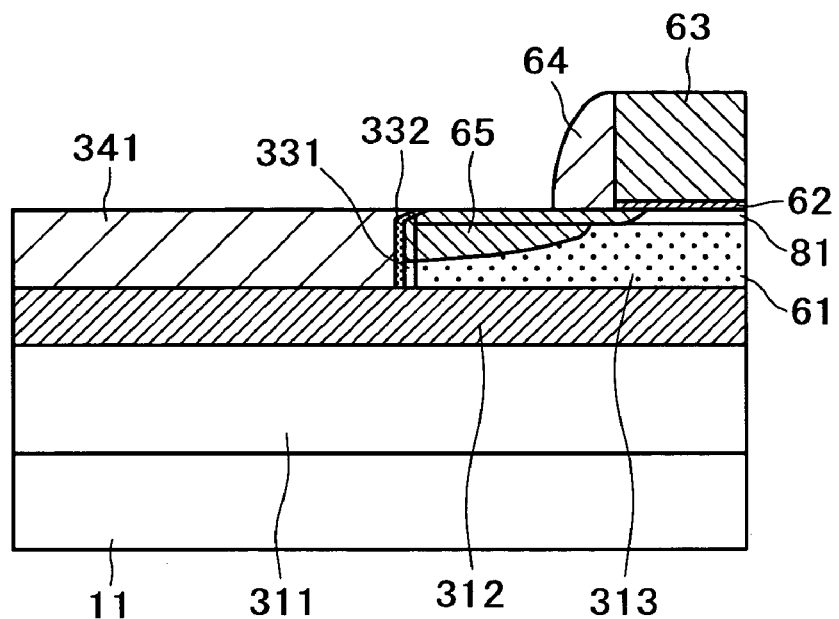
FIG. 35 is a cross-sectional view of the next step of the fabrication process in FIG. 34.

FIG. 35 is a cross-sectional view of the fabrication process after the well region 61, gate dielectric 62, gate polysilicon layer 63, gate side wall 64, and the source-drain region 65 are formed with channels made from the strain silicon layer 81, in accordance with a fifth embodiment of the present invention.

In the structure of the present embodiment, the section where the pn junction formed from the source-drain region 65 and well region 61 contacts the shallow trench isolation is in contact with the stable silicon dioxide 332 layer obtained from epitaxially formed silicon layer 331 so that low current leakage equivalent to a conventional MOS-FET not utilizing silicon-germanium can be obtained. There are no polycrystalline silicon sections when the silicon layer 261 is selectively formed by epitaxial growth and if polycrystalline silicon was deposited simultaneous with the forming of an epitaxial layer, then these sections are removed by oxidizing so that leakage current at the edges of the active region can be reduced.

The method for fabricating the shallow trench isolation of the sixth embodiment of the present invention is described next while referring to the cross-sectional process views of FIG. 36 through FIG. 38.

A multi-layer structure of silicon-germanium layer 311, a silicon dioxide layer 312, and single crystal silicon-germanium layer 313 is formed on the silicon substrate 11. This structure is formed by a bonding method or the SIMOX (Separation by Implanted Oxygen) method. This structure is generally referred to as the SOI (Silicon on Insulator) structure. Alternatively, in this method, the silicon layer can be used instead of the silicon-germanium layer 311. The layer thickness of the single crystal silicon-germanium layer 313 may vary within a range from 10 to 500 nanometers according to the forming method and application, but there should be no strain in the vicinity of the surface. By then epitaxially forming a silicon layer 81 of 10 to 30 nanometers over that entire surface, a channel layer subjected to tensile strain can be formed.

Figure 36:
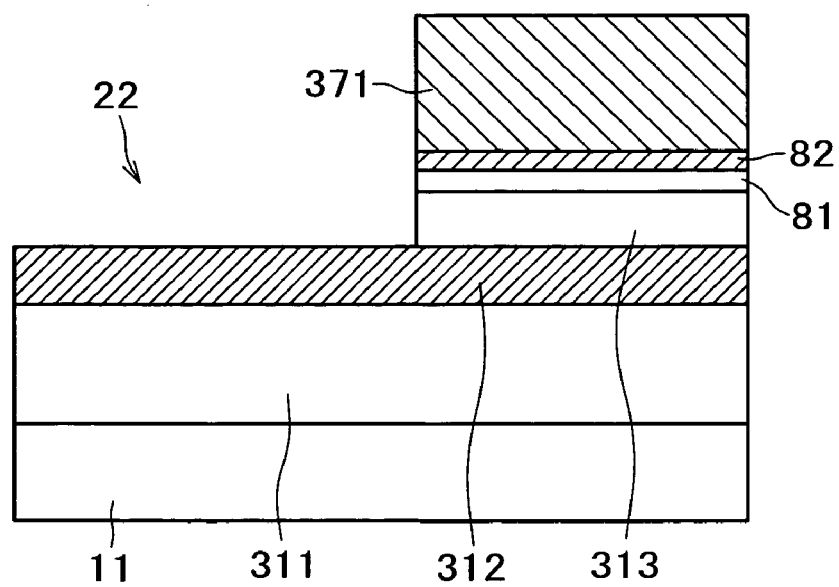
FIG. 36 is a cross-sectional view of the fabrication process for the shallow trench isolation region of the sixth embodiment of the present invention.
Figure 37:
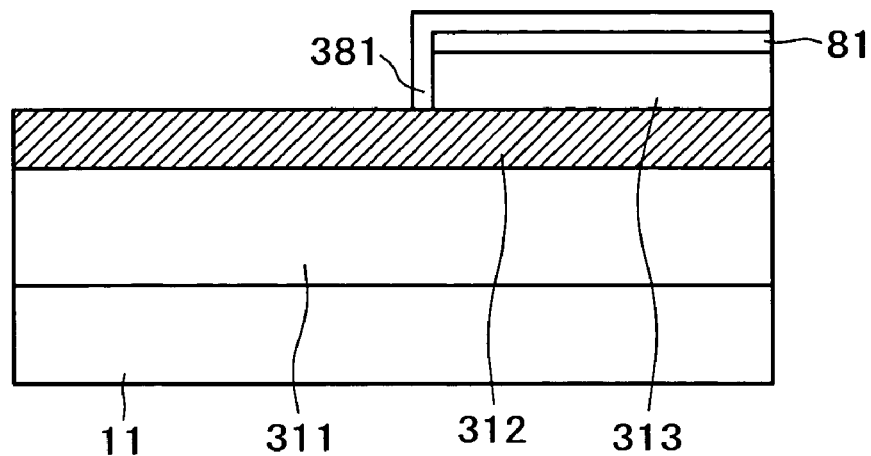
FIG. 37 is a cross-sectional view of the next step of the fabrication process in FIG. 36.

FIG. 36 is a cross-sectional view of the fabrication process after the surface of the silicon layer 81 has been oxidized from 1 to 10 nanometers and a silicon dioxide layer 82 formed over the entire wafer surface, and after the silicon dioxide layer 82 and silicon layer 81/single crystal silicon-germanium layer 313 are processed with the photoresist 371 as a mask using the lithography process and asymmetric dry etching to form the trench 22 in the single crystal silicon-germanium layer 313, in accordance with a sixth embodiment of the present invention. The depth of the trench 22 at this time depends on the layer thickness of the single crystal silicon-germanium layer 313. In the present embodiment, the trench 22 extends to the silicon dioxide layer 312. However, even in cases where not extending that far, the only difference is the presence of the silicon dioxide layer 312 in the lower section functioning as the insulator, and a shallow trench isolation may be formed using the same methods as in the first through the fourth embodiments. Further, the processing (etching) can be performed without the silicon dioxide layer 82 and silicon layer 81, using only the photoresist 371.

The photoresist 371 is removed by ashing and after undergoing the washing process, a silicon layer 381 is selectively formed epitaxially from 2 to 10 nanometers on the side walls in the trench 22 and on the surface of the silicon layer 81. When there is no silicon layer 81, this silicon layer 381 forms the channel layer subjected to tensile strain. The silicon layer 381 may instead be formed only on the side walls in the trench when the silicon dioxide layer 82 remains and a selective-epitaxial layer was epitaxially formed.

Figure 38:
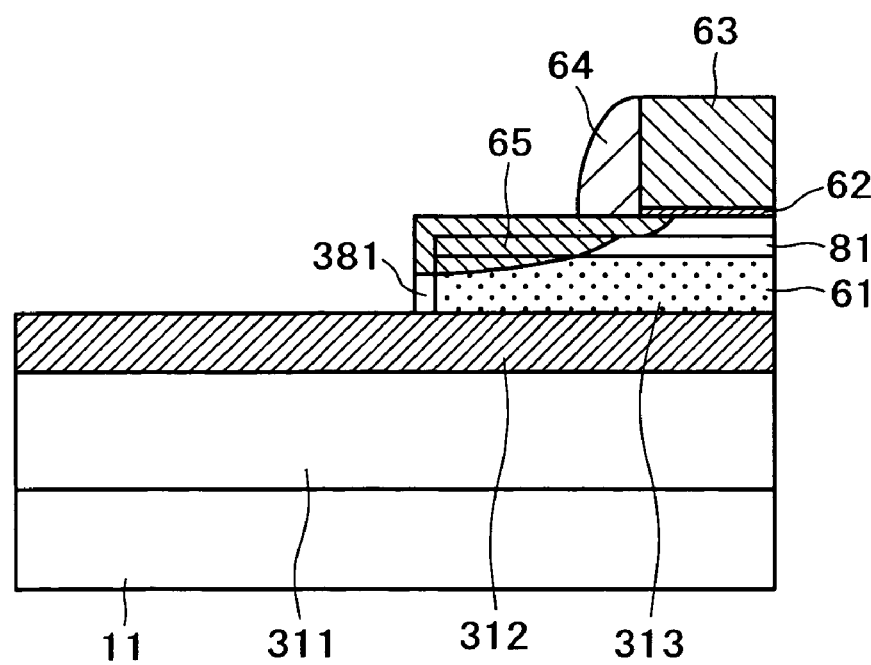
FIG. 38 is a cross-sectional view of the next step of the fabrication process in FIG. 37.

FIG. 38 is a cross-sectional view of the fabrication process after the well region 61, gate dielectric 62, gate polysilicon layer 63, gate side wall 64, and the source-drain region 65 are formed, in accordance with a sixth embodiment of the present invention. The MOS-FET is formed with channels made from the strain silicon layer 81 or a multi-layer structure comprised of the silicon layer 381 and the silicon layer 81. In this type of forming process, the gate dielectric 62 functions as an oxidation layer covering the inside of the trench 22.

Figure 39:
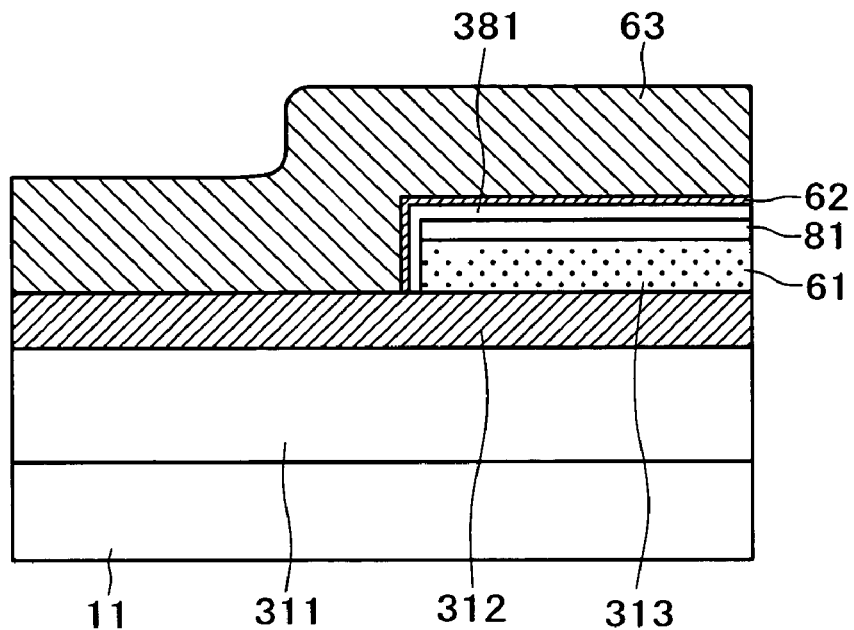
FIG. 39 is a cross-sectional view showing the structure along the gate width in the fabrication process of FIG. 36.

FIG. 39 is cross-sectional view of the fabrication process as seen from the direction of gate width, in accordance with a sixth embodiment of the present invention. There is no unstable oxidized germanium below the gate in the edge of the active region or side walls, and current leakage can be reduced.

Also during the forming process, the exposed portions of the single crystal silicon-germanium layer 313 are all covered by the silicon layer 381 so that no unstable oxidized germanium is formed during the oxidation process and no impurities occur to the oxidation furnace due to the germanium.

As described above, when forming the shallow trench isolation region of the strained silicon channel MOS-FET of the present invention, the oxidized layer in the trench can be formed from an oxidized silicon layer. Accordingly, there is no need to oxidize the silicon-germanium layer. The device pn-junction therefore does not come in contact with unstable germanium oxides and low current leakage shallow trench isolation equivalent to a conventional MOS-FET not utilizing silicon-germanium can therefore be obtained.

In the present invention, the leakage current can be reduced with the MOS-FET in the off state. A structure without a polycrystalline silicon layer at the edge of the active region or an oxidized layer of polycrystalline silicon can therefore be achieved.

Other Embodiments

The present invention includes, but is not limited to, the following additional embodiments.

A method is provided for fabricating a semiconductor device. The method comprises forming a first single crystal silicon layer on a single crystal silicon-germanium layer of a semiconductor substrate having a multi-layer structure including in order from the surface a single crystal silicon-germanium layer, a silicon dioxide layer, and one of a silicon and a silicon-germanium layer; oxidizing the first single crystal silicon layer; forming a first thermal oxide layer on the surface of the first single crystal silicon layer; forming a silicon nitride layer on the first thermal oxide layer; forming a trench extending to within the single crystal silicon-germanium layer in a multi-layer structure including in order from the surface the silicon nitride layer, the first thermal oxide layer, the first single crystal silicon layer, and the first single crystal silicon-germanium layer; forming the second single crystal silicon layer on a side wall of the single crystal silicon-germanium layer and the first single crystal silicon layer within the trench; oxidizing the second single crystal silicon layer; forming a second thermal oxide layer on a surface of the second single crystal silicon layer; and embedding an insulator inside the trench; forming a device isolation region; forming a device in an active region on the single crystal silicon-germanium layer separated by the device isolation region, wherein the step of forming the device in the active region includes forming a doped region of a depth extending within the single crystal silicon-germanium layer below the first single crystal silicon layer.

A method is provided for fabricating a semiconductor device. The method comprises forming a first single crystal silicon layer on a semiconductor substrate containing a single crystal silicon-germanium layer on the surface; oxidizing the first single crystal silicon layer and forming a first thermal oxide layer on the surface of the first single crystal silicon layer; forming a silicon nitride layer on the first thermal oxide layer; removing the section of the silicon nitride layer forming the device isolation region; forming a side wall silicon dioxide layer on the side wall of the first thermal oxide layer and the silicon nitride layer; forming a trench in the single crystal silicon germanium layer with the silicon nitride layer and side wall silicon dioxide layer as a mask; forming a second single crystal silicon layer inside the trench; selectively removing the side wall silicon dioxide layer; oxidizing the second single crystal silicon layer and the first single crystal silicon layer of sections exposed, the step of oxidizing including the steps of, removing the side wall silicon dioxide layer, and forming a second thermal oxide layer on the surface; and embedding an insulator inside the trench; forming a device isolation region; forming a device in an active region on the single crystal silicon-germanium layer separated by the device isolation region, wherein the step of forming the device includes the step of forming a dopant dope region of a depth to reach within the single crystal silicon-germanium layer below the first single crystal silicon layer.

A semiconductor device is provided with a trench in a silicon-germanium layer formed on the semiconductor substrate, wherein the sidewalls and bottom of the trench are a silicon-germanium layer, and wherein a silicon film is interposed between the dielectric filled inside the trench, and wherein a silicon-germanium layer on the bottom and side walls of the trench, and wherein oxidation of the silicon film is in contact with the dielectric side.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method of fabricating a semiconductor device, the method comprising:

forming a first single crystal silicon layer on a semiconductor substrate containing a single crystal silicon-germanium layer on the surface;

forming a first thermal oxide layer on the surface of said first single crystal silicon layer;

forming a silicon nitride layer on said first thermal oxide layer;

forming a trench region to a depth extending into said single crystal silicon-germanium layer on a multi layer structure made from said single crystal silicon-germanium layer, said first single crystal silicon layer, said first thermal oxide layer, and said silicon nitride layer;

forming a second single crystal silicon layer inside said trench region;

forming a second thermal oxide layer on the surface of said second single crystal silicon layer;

embedding an insulator inside said trench region, thereby forming a device isolation region; and forming a device in an active region separated by said device isolation region, wherein the step of forming said device in said active region includes forming a doped region of a depth to reach within said single crystal silicon-germanium layer below said first single crystal silicon layer, and wherein the step of forming said second single crystal silicon layer includes using selective epitaxial growth.

2. The method of fabricating a semiconductor device according to claim 1, wherein said insulator embedded inside said trench region is a silicon dioxide layer deposited over the entire surface.

3. The method of fabricating a semiconductor device according to claim 1, wherein said semiconductor substrate is a single crystal silicon wafer, and wherein said single crystal silicon-germanium layer is a graded profile layer epitaxially formed from said single crystal silicon wafer towards the surface with a varied germanium ratio.

4. The method of fabricating a semiconductor device according to claim 1, wherein the step of embedding an insulator comprises:

leveling the insulator material by chemical-mechanical polishing, using said silicon nitride layer on said active region as a mechanical stopper;

removing said silicon nitride layer; and removing said first thermal oxide layer.

5. The method of fabricating a semiconductor device according to claim 1, wherein the step of forming said device in said active region further comprises:

forming well regions on said active region;
forming a gate dielectric layer on said first single crystal silicon layer;
forming gate polycrystalline silicon on said gate dielectric layer;
forming a gate side wall structure; and
forming source drain regions.

6. A method of fabricating a semiconductor device, the method comprising:
preparing a semiconductor substrate having a single crystal silicon-germanium layer and a first single crystal silicon layer formed on said single crystal silicon-germanium layer;
forming a first silicon oxide layer on the surface of said first single crystal silicon layer;
forming a silicon nitride layer on said first silicon oxide layer;
forming a trench region to a depth extending into said single crystal silicon-germanium layer on a multi-layer structure made from said single crystal silicon-germanium layer, said first single crystal silicon layer, said first silicon oxide layer, and said silicon nitride layer;
forming a second single crystal silicon layer inside trench region and a polycrystalline layer on a side wall of said silicon nitride layer;
forming a second silicon oxide layer on said second single crystal silicon layer and said polycrystalline layer;
forming a third silicon oxide layer inside said trench region and over said silicon nitride layer;
leveling said third silicon oxide layer by chemical-mechanical polishing, using said silicon nitride layer as a mechanical stopper as said polycrystalline layer remains, thereby forming a device isolation region;
removing said silicon nitride layer;
oxidizing said polycrystalline layer after the step of leveling said third silicon oxide layer; and
forming a device in an active region separated by said device isolation region,
wherein the step of forming said device in said active region includes forming a doped region of a depth to reach within said single crystal silicon-germanium layer below said first single crystal silicon layer.

7. The method of fabricating a semiconductor device according to claim 6, further comprising removing a fourth silicon oxide layer formed in the step of oxidizing said polycrystalline layer.

8. The method of fabricating a semiconductor device according to claim 6, further comprising removing a part of said second silicon oxide layer, wherein the step of removing a part of said second silicon oxide layer includes removing a fourth silicon oxide layer formed in the step of oxidizing said polycrystalline layer.

9. The method of fabricating a semiconductor device according to claim 6, wherein the step of oxidizing said polycrystalline layer is executed before the step of removing said silicon nitride layer.

10. The method of fabricating a semiconductor device according to claim 6, wherein the step of preparing said semiconductor substrate includes the step of forming said first single crystal silicon layer on said single crystal silicon-germanium layer.

11. The method of fabricating a semiconductor device according to claim 6, wherein the step of forming said second single crystal silicon layer and said polycrystalline layer is executed by epitaxial growth.

12. The method of fabricating a semiconductor device according to claim 6, wherein said first silicon oxide layer is a thermal oxide layer.

13. The method of fabricating a semiconductor device according to claim 6, wherein said second silicon oxide layer is a thermal oxide layer.

14. The method of fabricating a semiconductor device according to claim 6, wherein the step of forming said device further comprises:
forming well regions on said active region;
forming a gate dielectric layer on said first single crystal silicon layer;
forming gate polycrystalline silicon on said gate dielectric layer;
forming a gate side wall structure; and
forming source drain regions.

15. A method of fabricating a semiconductor device, the method comprising:
preparing a semiconductor substrate having a single crystal silicon-germanium layer and a first single crystal silicon layer formed on said single crystal silicon-germanium layer;
forming a first silicon oxide layer on the surface of said first single crystal silicon layer;
forming a silicon nitride layer on said first silicon oxide layer;
forming a trench region to a depth extending into said single crystal silicon-germanium layer on a multi-layer structure made from said single crystal silicon-germanium layer, said first single crystal silicon layer, said first silicon oxide layer, and said silicon nitride layer;
forming a second single crystal silicon layer inside said trench region by selective epitaxial growth;
forming a second silicon oxide layer on said second single crystal silicon layer;
forming a third silicon oxide layer inside said trench region and over said silicon nitride layer;
leveling said third silicon oxide layer by chemical-mechanical polishing, using said silicon nitride layer as a mechanical stopper, thereby forming a device isolation region;
removing said silicon nitride layer; and
forming a device in an active region separated by said device isolation region,
wherein the step of forming said device in said active region includes forming a doped region of a depth to reach within said single crystal silicon-germanium layer below said first single crystal silicon layer.

16. The method of fabricating a semiconductor device according to claim 15, wherein the step of preparing said semiconductor substrate includes the step of forming said first single crystal silicon layer on said single crystal silicon-germanium layer.

17. The method of fabricating a semiconductor device according to claim 15, wherein said first silicon oxide layer is a thermal oxide layer.

18. The method of fabricating a semiconductor device according to claim 15, wherein said second silicon oxide layer is a thermal oxide layer.

19. The method of fabricating a semiconductor device according to claim 15, wherein the step of forming said device further comprises:
forming well regions on said active region;
forming a gate dielectric layer on said first single crystal silicon layer;
forming gate polycrystalline silicon on said gate dielectric layer;
forming a gate side wall structure; and
forming source drain regions.

* * * * *